(12) United States Patent
Nakamura

(10) Patent No.: US 6,229,168 B1
(45) Date of Patent: May 8, 2001

(54) FERROELECTRIC CAPACITOR AND A METHOD FOR MANUFACTURING THEREOF

(75) Inventor: Takashi Nakamura, Ukyo-Ku (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/435,935

(22) Filed: Nov. 9, 1999

Related U.S. Application Data

(62) Division of application No. 08/631,543, filed on Apr. 12, 1996, which is a continuation of application No. 08/280,480, filed on Jul. 26, 1994, now abandoned.

(30) Foreign Application Priority Data

Jan. 13, 1994 (JP) .......................................... 6-2243
Jan. 13, 1994 (JP) .......................................... 6-2247
Jan. 13, 1994 (JP) .......................................... 6-2445
Jan. 14, 1994 (JP) .......................................... 6-2246

(51) Int. Cl.[7] ........................... H01L 29/76; H01L 29/94; H01L 31/062; H01L 31/113; H01L 31/119
(52) U.S. Cl. ........................................... 257/295; 257/310
(58) Field of Search ............................... 257/295, 306, 257/310, 758

(56) References Cited

U.S. PATENT DOCUMENTS

| | | |
|---|---|---|
| 4,982,309 | 1/1991 | Shepherd . |
| 5,003,428 | 3/1991 | Shepherd . |
| 5,005,102 * | 4/1991 | Larson ................................. 361/313 |
| 5,053,917 * | 10/1991 | Miyasaka et al. .................... 361/321 |
| 5,122,923 | 6/1992 | Matsubara et al. . |
| 5,164,808 * | 11/1992 | Evans Jr. et al. .................... 361/305 |
| 5,191,510 * | 3/1993 | Huffman ............................... 361/313 |
| 5,240,906 | 8/1993 | Bednorz et al. . |
| 5,293,510 | 3/1994 | Takenaka . |
| 5,343,353 * | 8/1994 | Miki et al. ............................ 361/322 |
| 5,407,855 | 4/1995 | Maniar et al. ............................ 438/3 |
| 5,471,364 | 11/1995 | Summerfelt et al. . |
| 5,489,548 | 2/1996 | Nishioka et al. ..................... 438/396 |
| 5,555,486 | 9/1996 | Kingon et al. ........................ 361/305 |
| 5,566,045 | 10/1996 | Summerfelt et al. ............. 361/321.1 |
| 5,573,979 | 11/1996 | Tsu et al. .............................. 438/396 |
| 5,581,436 | 12/1996 | Summerfelt et al. ............. 361/321.1 |
| 5,612,574 | 3/1997 | Summerfelt et al. ................ 257/783 |
| 5,638,319 | 6/1997 | Onishi et al. ......................... 365/145 |
| 5,708,284 | 1/1998 | Onishi .................................. 257/295 |
| 5,834,357 | 11/1998 | Kang .................................... 438/396 |
| 5,874,364 | 2/1999 | Nakatayashi et al. ............... 438/738 |
| 5,879,957 | 3/1999 | Joo ............................................ 438/3 |
| 6,052,271 | 4/2000 | Nakamura ............................ 361/303 |

\* cited by examiner

*Primary Examiner*—Steven Loke
*Assistant Examiner*—Douglas W. Owens
(74) *Attorney, Agent, or Firm*—Merchany & Gould P.C.

(57) ABSTRACT

It is an object of the present invention to provide a ferroelectric capacitor which maintains high ferroelecticity. A silicon oxide layer 2, a lower electrode 12, a ferroelectric layer 8 and an upper electrode 10 are formed on a silicon substrate 2. The lower electrode 12 is formed by an alloy layer made of iridium and platinum. The alloy layer of the lower electrode 12 can be formed under appropriate lattice constant correspond with a kind and composition of the ferroelectric layer 8. So that, a ferroelectric layer having excellent ferroelectricity can be obtained. Also, it is possible to prevent vacancy of oxygen in the ferroelectric layer 8.

6 Claims, 29 Drawing Sheets

AXIS OF ORDINATES   10μC/cm²·div
AXIS OF ABSCISSAS   54.3KV/cm·div

F I G. 6

| | Pt | Ir |
|---|---|---|
| ATOMIC WEIGHT | 195.08 | 192.22 |
| COLOR CRYSTAL STRUCTURE | ELEMENTS OF THE PLATINUM GROUP FACE-CENTERED CUBIC | ELEMENTS OF THE PLATINUM GROUP FACE-CENTERED CUBIC |
| LATTICE CONSTANT (Å) | 3.923 | 3.839 |
| DENSITY (g/cm$^3$) | 21.46 | 22.42 |
| MELTING POINT (°C) | 1700 (5%Ir=1777, 10%Ir=1899) | 2410 |
| BOILNG POINT (°C) | 3800 | 4100 |
| REACTION TO GAS | $O_2$:NONE, $Cl_2$(>250°C):$PtCl_2$ $F_2$ (UNDER HIGH TEMPERATURE):$PtF_4$ $H_2$:POWDER OCCLUSION | AIR (<800):NONE, $O_2$ (>800) $IrO_2$ $Cl_2$ (HEATED): CHLORIDE $F_2$ (HEATED): FLUORIDE |
| REACTION TO LIQUID | INORGANIC ACID: NONE, AQUA REGIA: SOLUBLE, KCN WATER HEATED:SULFURIC ACID FUSED ALKALI | $H_2O$, INOEGANIC ACID, AQUA REGIA: NONE, FUSED KOH+$KNO_3$: SOLUBLE |
| LINEAR EXPANSION RATIO ($10^{-4}$/K) | 0.0899 (0~100) 0.0994 (0~900) | 0.0658 (0~100) |
| THERMAL CONDUCTIVITY (W/m·K) | 71.4 (300K) | 147 (300K) |
| WORK FUNCTION (eV) | 5.84 (100) 5.93 (111) | 5.42 (110) 5.76 (111) |
| RESISTANCE ($10^{-6}$Ωcm) | 10.6 | 5.3 |
| RESISTANCE OF OXIDE ($10^{-6}$Ωcm) | $PtO_2$ (RHOMBIC) 600 | $IrO_2$ (TETRAGONAL) 49 |

ELECTRIC FIELD (kV/cm)
Pt/PZT/Pt/IrO2/Poly-Si
AXIS OF
ORDINATES : 10.5 μC/cm²·div
AXIS OF
ABSCISSAS : 54.3kV/cm·div ELECTRIC FIELD (kV/cm)
Pt/PZT/Pt/IrO2/Poly-Si
AXIS OF
ORDINATES : 9.8 μC/cm²·div
AXIS OF
ABSCISSAS : 54.3kV/cm·div F I G. 3 5
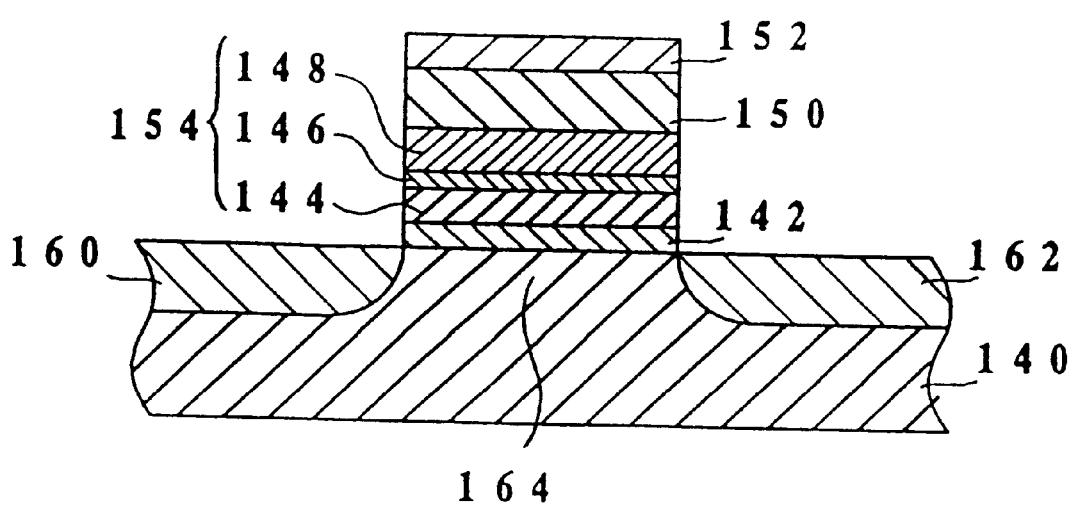

FERROELECTRIC CAPACITOR AND A METHOD FOR MANUFACTURING THEREOF

This application is a divisional of Ser. No. 08/631,543 filed Apr. 12, 1996, the disclosure of which is incorporated by reference, which is a continuation of Ser. No. 08/280,480 filed Jul. 26, 1994 (now abandoned).

BACKGROUND OF THE INVENTION

1. Field of the Invention

The present invention relates to a ferroelectric capacitor, more specifically, a ferroelectric capacitor which is improved ferroelectricity.

2. Description of the Prior Art

A conventional ferroelectric capacitor is shown in FIG. 1. A silicon oxide layer 4 is formed on a silicon substrate 2, then a lower electrode 6 made of platinum is formed thereon. A PZT ($PbZr_xTi_{1-x}O_3$) layer 8 as a ferroelectric layer is formed on the lower layer 6. Further, an upper layer 10 made of platinum is formed thereon. So that, a ferroelectric capacitor is formed by the lower electrode 6, the PZT layer 8 and the upper electrode 10.

The reason why the lower electrode 6 is made by platinum is as follows. The PZT layer 8 must be formed on a layer which is oriented axially or which has mono-crystal for obtaining better matching of lattice constant. When the PZT layer 8 is formed on an amorphous layer, ferroelectricity of the PZT layer is decreased because the amorphous layer is a layer which is not oriented axially. On the other hand, the lower electrode 6 must be formed under insulated condition from the silicon substrate 2. So that, the silicon oxide layer 4 is formed on the silicon substrate 2. Also the silicon oxide layer 4 is made of amorphous. Generally, a layer formed on amorphous becomes as a layer which is not oriented axially. However, platinum has a characteristics that becomes a layer which is oriented axially even when it is formed on amorphous. Therefore, platinum is utilized for the lower electrode 6.

FIG. 3A illustrates a structure of a memory device which is proposed by using a ferroelectric capacitor. A source region 104 and a drain region 106 are formed in the silicon substrate 102, a gate electrode 108 is formed on the channel region. A plug 110 made of poly silicon is formed on the drain region 106 of this transistor structure. Further, a platinum layer 112 is formed on the poly silicon plug 110, also PZT layer 114 is formed thereon as ferroelectric material. Further, a platinum layer 116 is formed on the PZT layer 114. So that, the memory device is formed.

Because of manufacturing process of PZT is totally different from that of transistor, the platinum layer 112, PZT layer 114, the platinum layer 116 are formed on the poly silicon plug 110 as shown in the figure.

The conventional ferroelectric capacitor shown in FIG. 1 has following issues to resolve. At first, it is depending on kind and composition of the ferroelectric material, a possibility of mismatching for lattice constant between the ferroelectric material and the platinum layer formed as the lower electrode is increased, so that ferroelectricity of the capacitor is possibly degraded.

Subsequently, platinum has a characteristics that oxygen goes though it easily, so that oxygen contained in the ferroelectric material (such as PZT) leaks therefrom. Therefore, degradation for retention property and fatigue property beside repeated polarization reverse is caused. That is, oxygen contained in the ferroelectric material leaks through columnar crystal structure of platinum as shown in FIG. 2.

It is necessary to resolve following issues to realize a conventional memory device shown in FIG. 3A.

In FIG. 3A, the platinum layer 112 is formed directly on the poly silicon plug 110. So that, platinum and poly silicon cause chemical reaction, then silicide is formed. Once silicide is formed, it is not possible to obtain high ferroelectricity. Even if a ferroelectric layer is formed thereon, because of lattice constant between silicide and the ferroelectric layer is totally different each other. Also, since surface of the poly silicon plug 110 has roughness, platinum formed on the poly silicon plug 110 can not be oriented. Therefore, the ferroelectric layer formed thereon does not have high ferroelectricity. FIG. 3B shows a hysteresis curve of PZT formed on platinum which is formed on poly silicon. As it is clear from the figure, remanent polarization Pr is almost disappeared from the figure. The same issue is observed when tungsten is used as the plug.

To resolve above described problems, there is a case that a tantalum layer which does not react with the platinum layer 112 is formed on the poly silicon plug 110, then the platinum layer 112 is formed thereon. According to above way, it is possible to prevent forming polycide as a result of chemical reaction of platinum and poly silicon, also better ferroelectricity can be observed due to improvement of orientation for the ferroelectric layer. However, surface of the tantalum layer 113 maintains roughness of the surface of the poly silicon plug 110, as shown in FIG. 4A. Therefore, platinum formed thereon can not be oriented axially. So that, the ferroelectric layer formed on the platinum does not have high ferroelectricity. Also, there is a issue that tantalum oxide is formed in a boundary between the poly silicon plug 110 and the tantalum layer 113 caused by thermal treatment. Therefore, dielectric constant of the memory device is decreased.

SUMMARY OF THE INVENTION

It is an object of the present invention to provide a ferroelectric capacitor which realizes less degradation for retention property and fatigue property beside repeated polarization reverse.

Also, another object of the present invention is to provide a ferroelectric capacitor maintains high ferroelecticity, less degradation for retention property, fatigue property and repeated polarization reverse.

Far another object of the present invention is to provide a dielectric capacitor and memory device having excellent characteristics.

A ferrolectric capacitor comprises:

a) a substrate of semiconductor;
b) a lower electrode located on the substrate of semiconductor, having an alloy layer made of platinum and iridium;
c) a ferroectric layer formed on the lower electrode contacting with the alloy layer of the lower electrode;
d) an upper electrode formed on the ferroelectric layer.

While the novel features of the invention are set forth in a general fashion, both as to organization and content, will be better understood and appreciated, along with other objections and features thereof, from the following detailed description taken in conjunction with the drawings.

BRIEF DESCRIPTION OF THE DRAWINGS

FIG. 6 is a view illustrating characteristics of both platinum and iridium.

FIG. 35 is a view illustrating a structure of nonvolatile memory for an embodiment in the present invention.

DESCRIPTION OF THE PREFERRED EMBODIMENT

Figure 5:
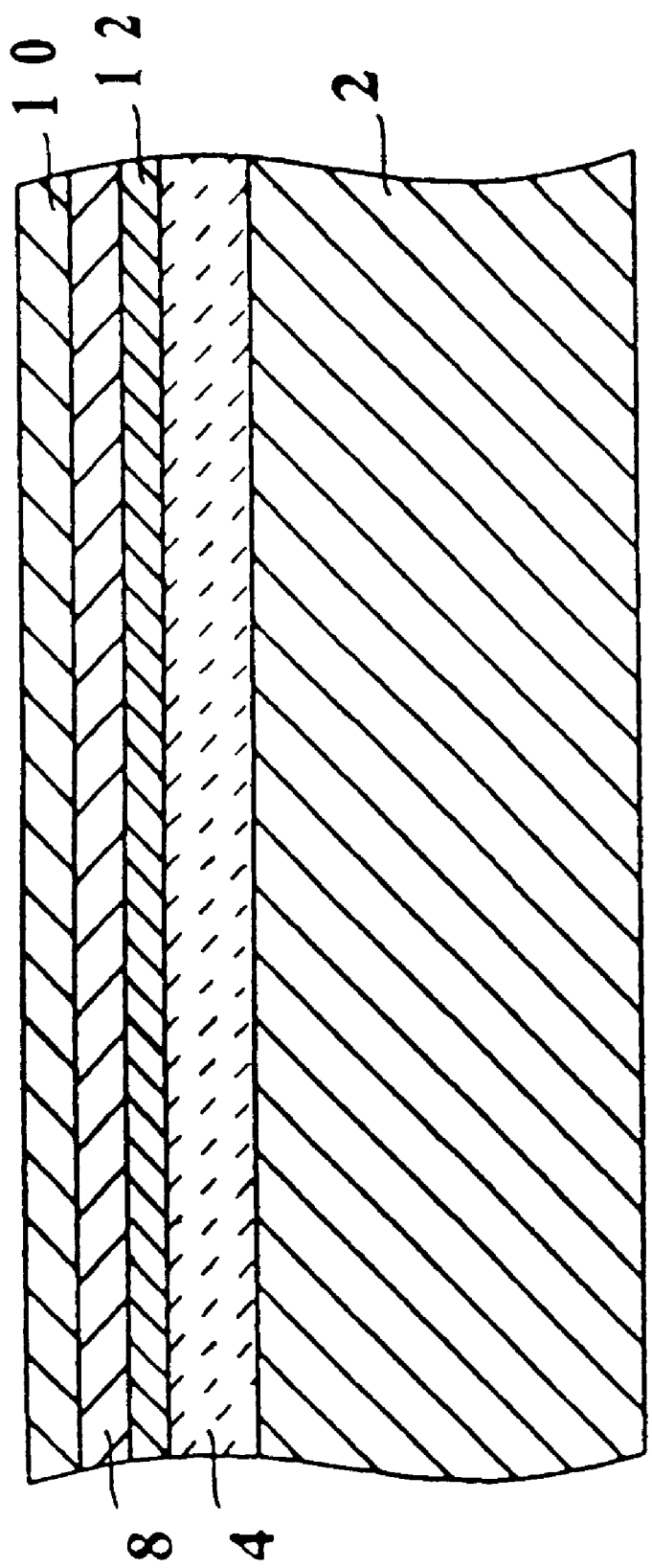
FIG. 5 is a view illustrating a structure of ferroelectric capacitor for an embodiment in the present invention.

A structure of an embodiment for a ferroelectric capacitor in the present invention will be disclosed in FIG. 5. In this embodiment, a silicon oxide layer 4, a lower electrode 12, a ferroelectric layer 8 and an upper electrode 10 are formed on a silicon substrate 2. The lower electrode 12 is made of alloy of platinum and iridium.

Characteristics of platinum and iridium are shown in FIG. 6 by comparison. As it is clear from the figure, characteristics of iridium is almost the identical to characteristics of platinum. Iridium is suitable material for electrodes, because of resistivity of iridium is lower than platinum. Also, lattice constant of platinum is 3.923 Å, in the meantime, lattice constant of iridium is 3.839 Å. So that, it is possible to set the value of lattice constant for alloy of platinum and iridium between 3.923 Å to 3.839 Å. That is, optimum lattice constant is obtainable depending on kind and composition of the ferroelectric material.

Figure 7:
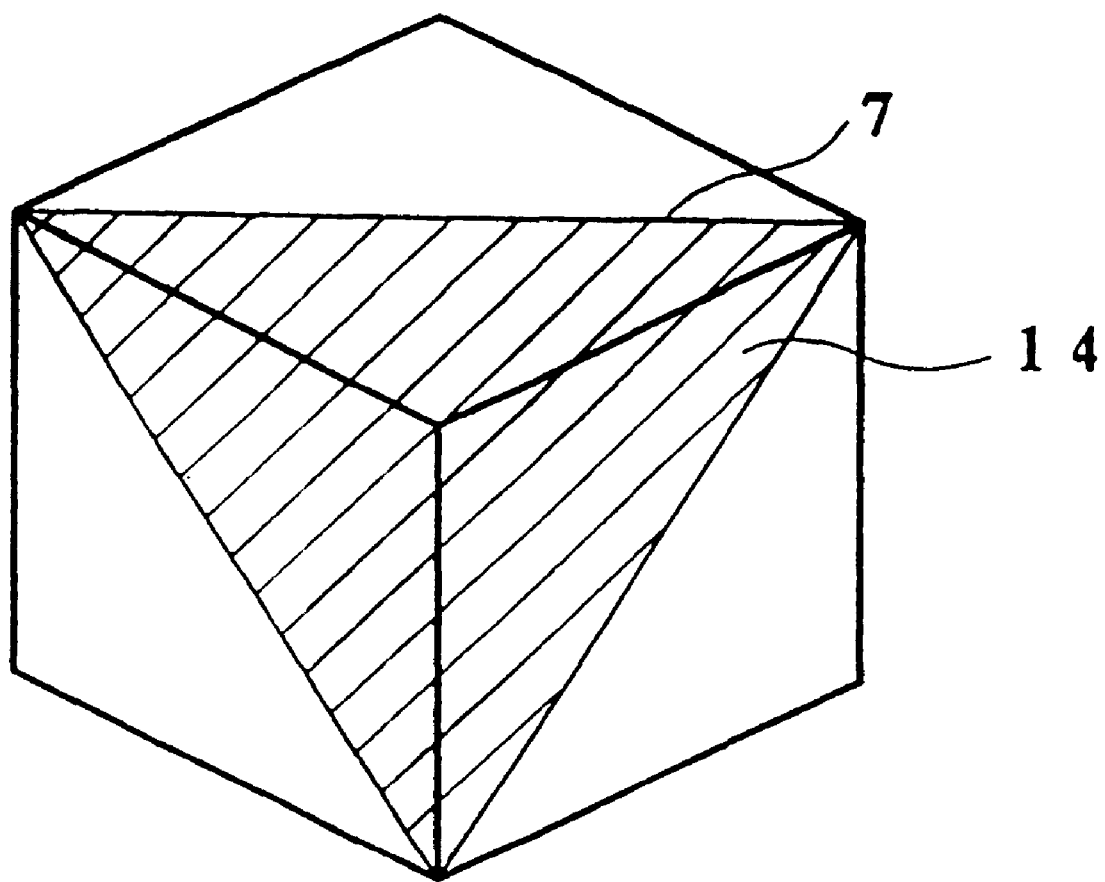
FIG. 7 is a view illustrating crystal face of platinum and iridium.

For instance, the ferroelectric layer 8 by using bismuth titanate ($Bi_4Ti_3O_{12}$) (hereinafter referred as BIT) will be disclosed. Lattice constant of BIT consist of a=5.45, b=5.41 and c=32.815. On the contrary, platinum and iridium used as the lower electrode 12 is oriented toward direction (111) as shown in FIG. 7. So that, it is necessary to equalize a band length L on the (111) axis of the lower electrode 12 to a=5.45 or b=5.41 to obtain a layer which is oriented toward c axis of BIT. In this embodiment, band length L can be 5.43 on (111) axis by making a composition ratio of the alloy for platinum and iridium as x=0.8 in $Pt_x Ir_{1-x}$. That is, a BIT layer having high ferroelectricity can be formed by carrying out matching among the lattice constant of BITs.

Figure 8:
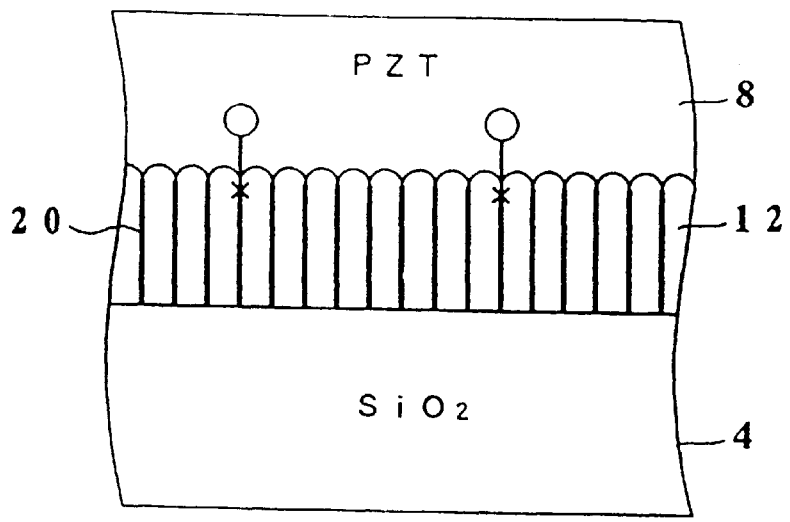
FIG. 8 is a view illustrating a structure to prevent leakage of oxygen by iridium oxygen layer in alloy of platinum and iridium.

Although, platinum has a characteristics that hard to react with oxygen, iridium can be oxidized under high temperature as shown in a chart of FIG. 6. Therefore, iridium can be oxidized slightly when thermal treatment is carried out to alloy of platinum and iridium. An iridium oxide layer 20 is formed between columnar crystal of platinum, so that the iridium oxide layer 20 blocks a path where oxygen go through. As a result, it is possible to prevent vacancy of oxygen in the PZT layer 8 (see FIG. 8).

Figure 9:
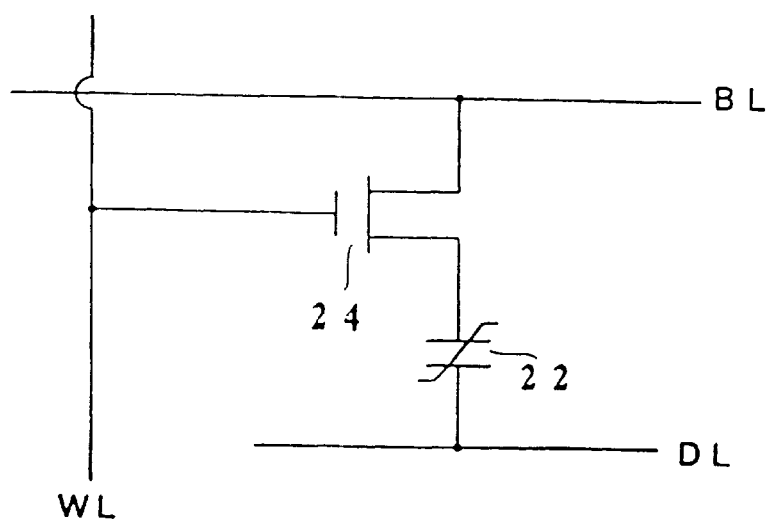
FIG. 9 is a view illustrating a nonvolatile memory device utilized a ferroelectric capacitor 22.

The ferroelectric capacitor thus formed as disclosed above can be applied to an nonvolatile memory device with combination of a transistor 24 as shown in FIG. 9.

Figure 10A:
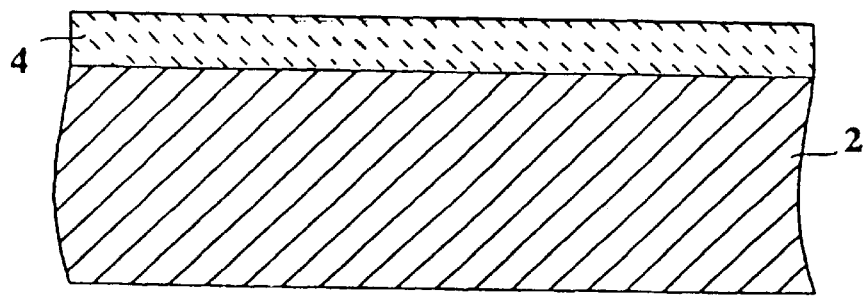
FIG. 10A to FIG. 10D are the view illustrating manufacturing process of ferroelectric capacitor shown in FIG. 5.
Figure 10B:
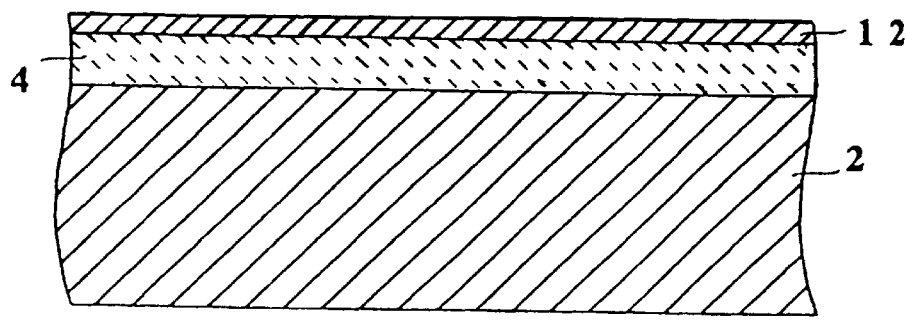

Manufacturing process of a ferroelectric capacitor for an embodiment in the present invention will be disclosed from FIG. 10A to FIG. 10D. Initially, a silicon oxide layer 4 is formed by thermal oxidizing surface of a silicon substrate 2 (FIG. 10A). Here, the silicon oxide layer 4 is formed in thickness of 600 nm. Then, alloy of platinum and iridium is formed on the silicon oxide layer 4 by utilizing the platinum and the iridium as a target (FIG. 10B). The alloy of platinum and iridium is used as a lower electrode 12 and the electrode is formed in thickness of 200 nm.

Figure 10C:
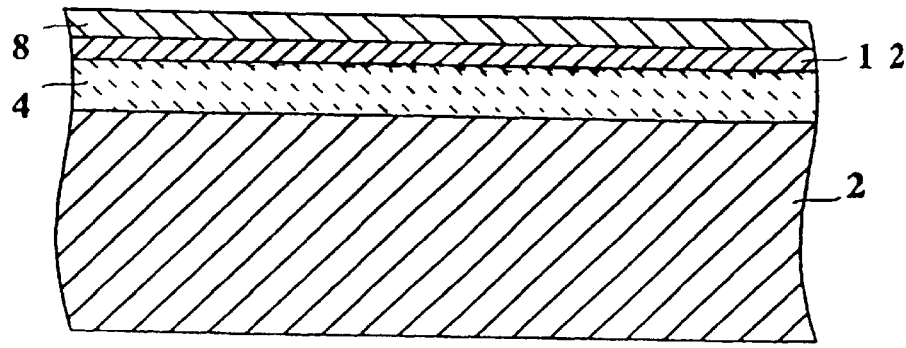

Subsequently, a PZT layer is formed on the lower electrode 12 as a ferroelectric layer 8 by sol-gel method (FIG. 10C). In this embodiment, solution mixture of $PB(CH_3COO)_2 \cdot 3H_2O$, $Zr(t-OC_4 H_9)_4$, $Ti(i-OC_3 H_7)_4$ is used for a precursor. After carrying out spin coating to the mixture, dry process is carried out at 150° C. Then preanneal is carried out under dry air atmosphere at 400° C. for 30 seconds. Above mentioned process is conducted by five times, then thermal treatment is carried out under oxygen atmosphere at above 700° C. So that, the ferroelectric layer 8 is formed in thickness of 250 nm. In this embodiment, PZT layer is formed under the condition that X is 0.52 in $PBZr_x Ti_{1-x}O_3$ (hereinafter referred as PZT (52/48)).

Figure 10D:
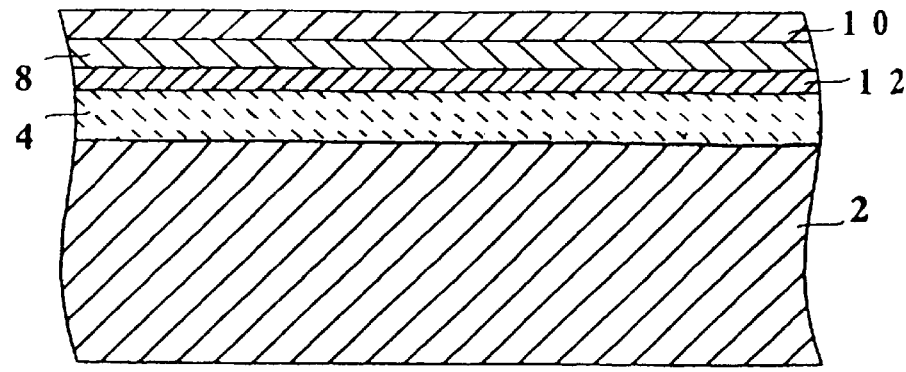

Further, an upper electrode 10 made of platinum is formed on the ferroelectric layer 8 by sputtering (FIG. 10D). So that, a ferroelectric capacitor can be formed.

In above disclosed embodiment, iridium is oxidized with the lower electrode 12 when carrying out thermal treatment to form the ferroelectric layer 8 at above 700° C. However, the thermal treatment can be carried out when the lower electrode 12 is formed.

Figure 11:
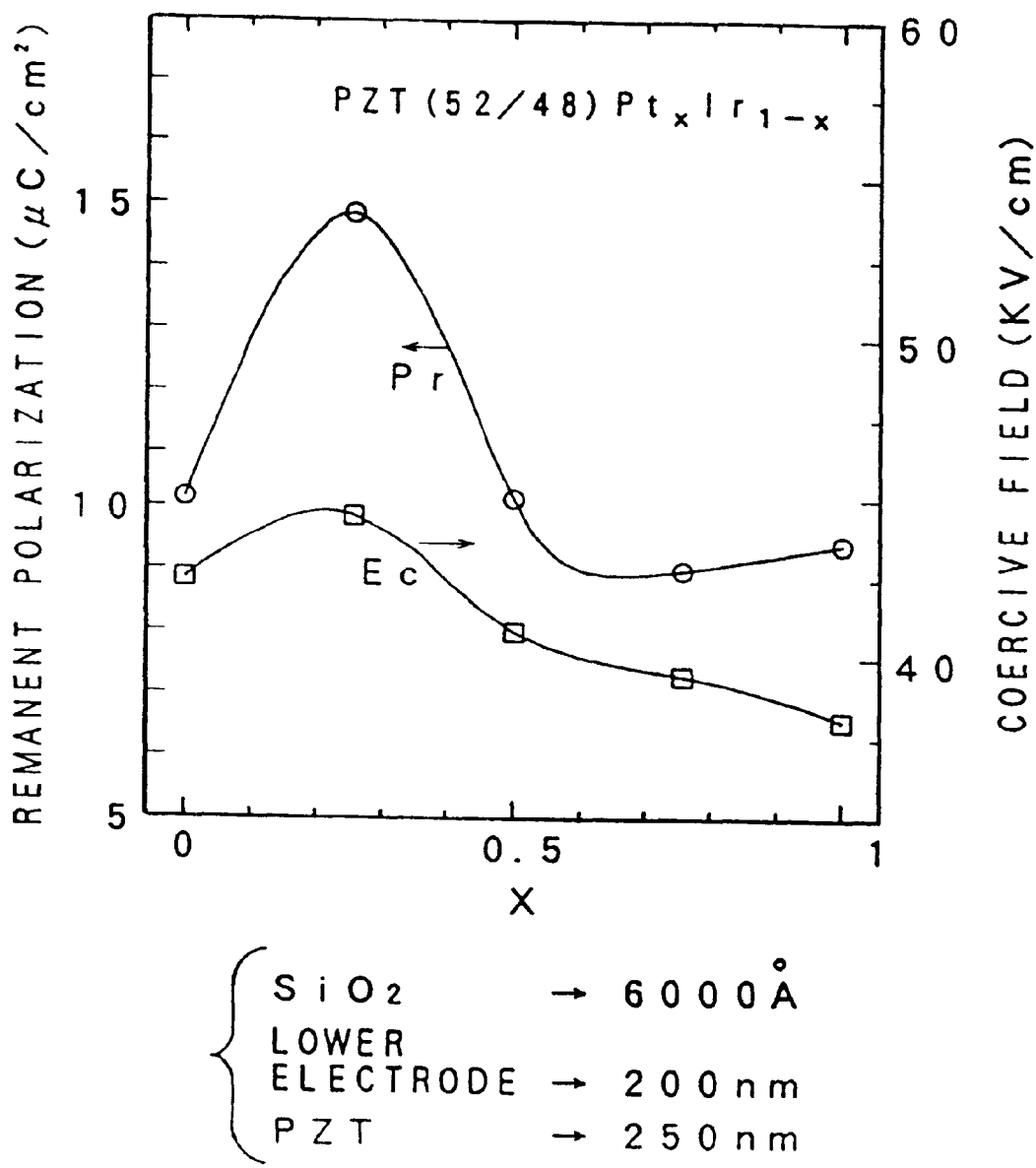
FIG. 11 is a view illustrating variation for remanent polarization Pr and coercive field Ec when com ration of platinum and iridium is changed.

FIG. 11 is a graph shows variation of remanent polarization Pr and coercive field Ec, when composition ratio x of platinum and iridium is varied by utilizing Pt Ir as the lower electrode 12 and PZT (52/48) as the ferroelectric layer 8. As it is clear from the figure, value of remenent polarization Pr is higher when utilize iridium and platinum to form the lower electrode 12, than only use platinum for the lower electrode 12. That is, ferroelectricity is improved when utilizing the alloy of iridium and platinum for the lower electrode 12. A remarkable improvement can be obtained within a range from 0% to 50% of platinum, particularly excellent improvement is obtained when composition ratio of platinum is approximately 25%.

Figure 12A:
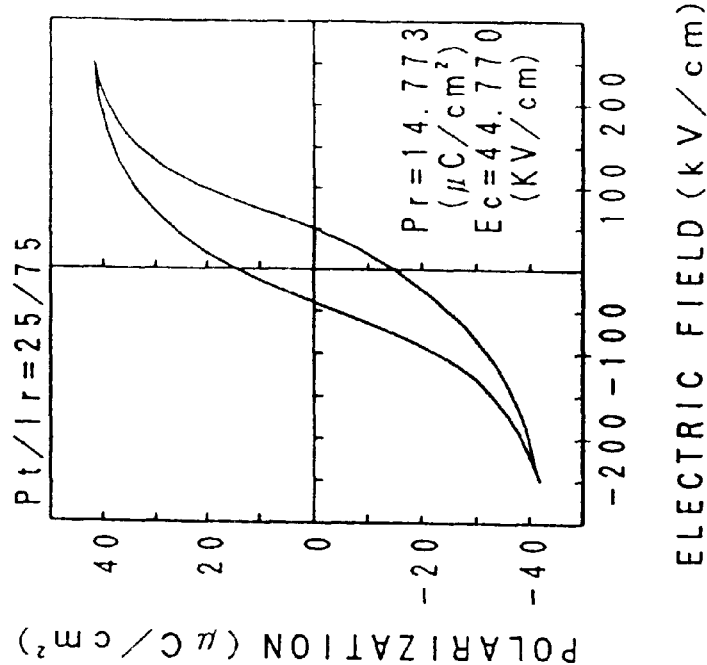
FIG. 12A and FIG. 12B are the view illustrating comparison hysteresis characteristics when utilize platinum for the lower electrode or utilize alloy of platinum and iridium for the lower electrode.
Figure 12B:
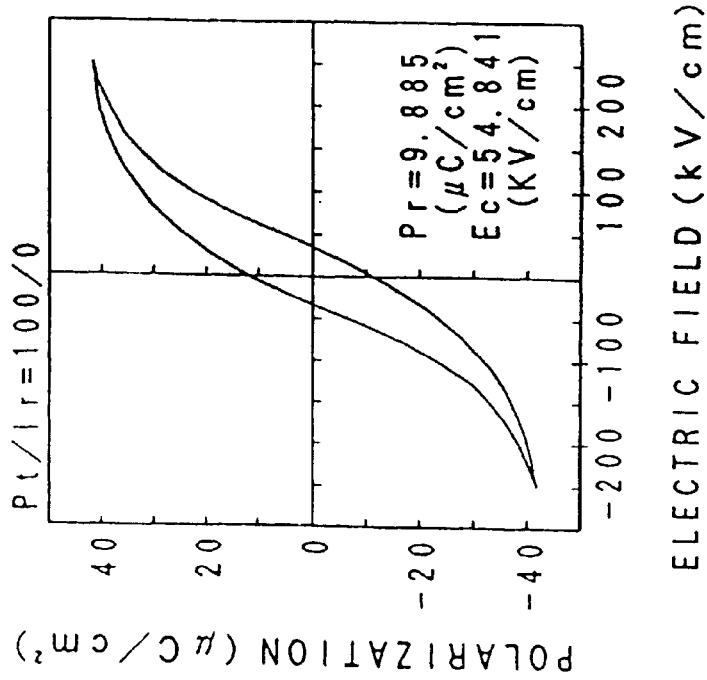

A hysteresis characteristics of a ferroelectric capacitor utilizing only platinum for the lower electrode 12 is shown in FIG. 12A. Also, another hysteresis characteristics of a ferroelectric capacitor utilizing alloy of platinum 25% and iridium 75% for the lower electrode 12 is shown in FIG. 12B. Here, thickness of the silicon oxide layer is 600 nm, thickness of the lower electrode is 200 nm and thickness of the PZT layer is 250 nm. In comparison with both graphs shown in FIG. 12A and FIG. 12B, it is clearly understand that the capacitor utilizing alloy (shown in FIG. 12B) shows excellent characteristics of remanent polarization Pr.

Figure 13A:
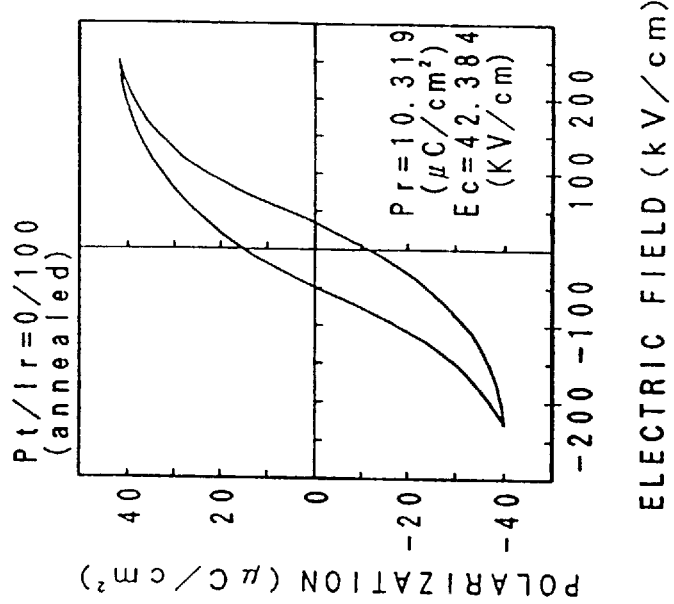
FIG. 13A is a view illustrating a hysteresis characteristics of the lower electrode made of iridium.
Figure 13B:
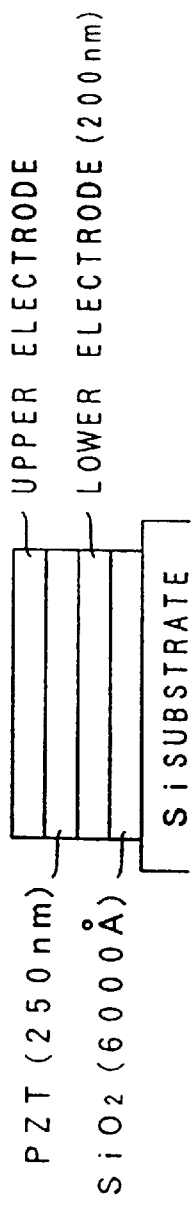
FIG. 13B is a view illustrating a structure to carry out a test shown in FIG. 13A.

Further, far another hysteresis characteristics of a ferroelectric capacitor utilizing only iridium for the lower electrode 12 is shown in FIG. 13A. Although utilizing only iridium for the lower electrode 12, remanent polarization Pr and coercive field Ec are improved. A result of experiment shown in FIG. 13A is obtained by carrying out an experiment under a structure shown in FIG. 13B.

Figure 14:
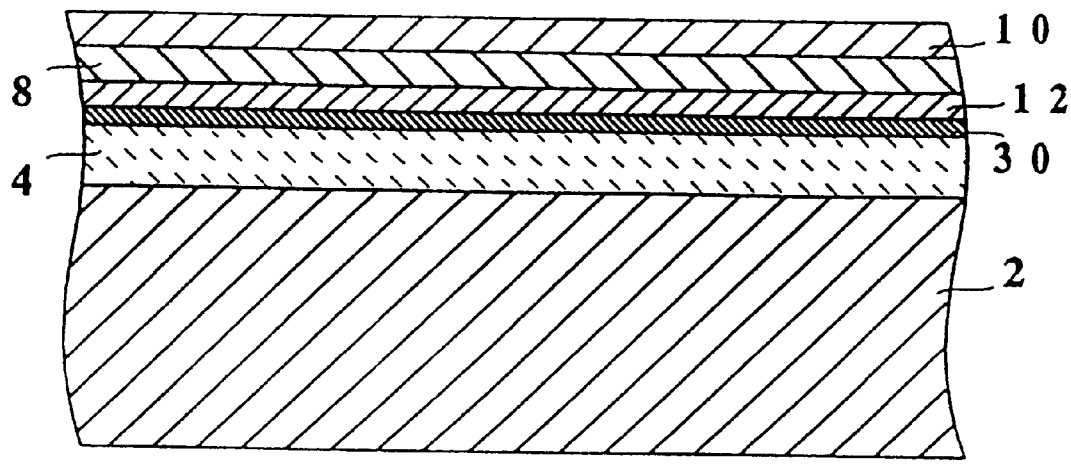
FIG. 14 is a view illustrating an embodiment when forming a buffer wafer 30 between the lower electrode 12 and silicon oxide layer 4.

FIG. 14 shows a structure of ferroelectric capacitor for another embodiment in the present invention. In this embodiment, a titanium layer is formed between a lower electrode 12 and a silicon oxide layer 4 as a buffer layer 30. Since, adsorption between iridium and the silicon oxide layer 4 is not enough to adhere both of them, so that, ferrolectric characteristics is decreased due to causing partial delamination. Particularly, the issue is noticeable when ratio of iridium in the alloy is heightened. To resolve the issue, in this embodiment, the titanium layer 4 having excellent adsorption with iridium is formed. So that, ferroelectricity can be improved. The titanium layer is formed by sputtering method.

Figure 15B:
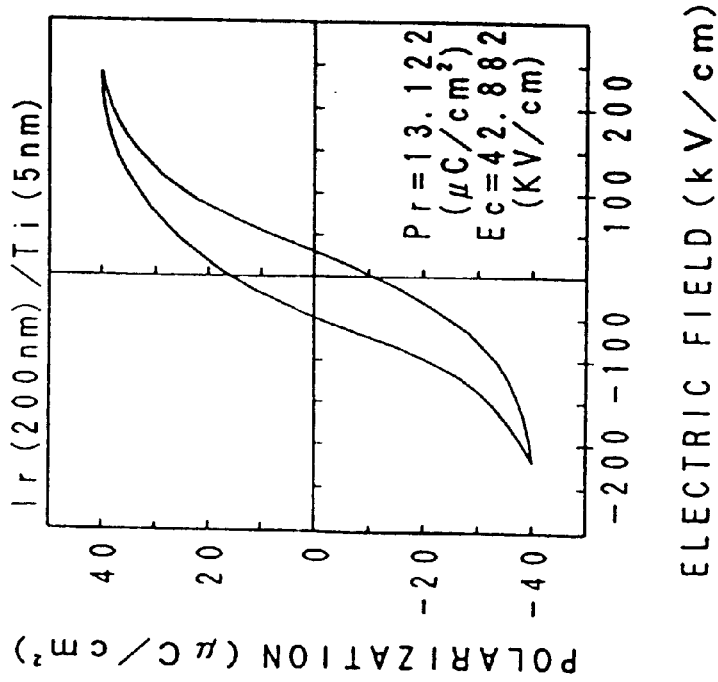
FIG. 15A and FIG. 15B are the view illustrating a hysteresis characteristics when utilize the iridium layer, the platinum layer as the buffer layer.
Figure 15A:
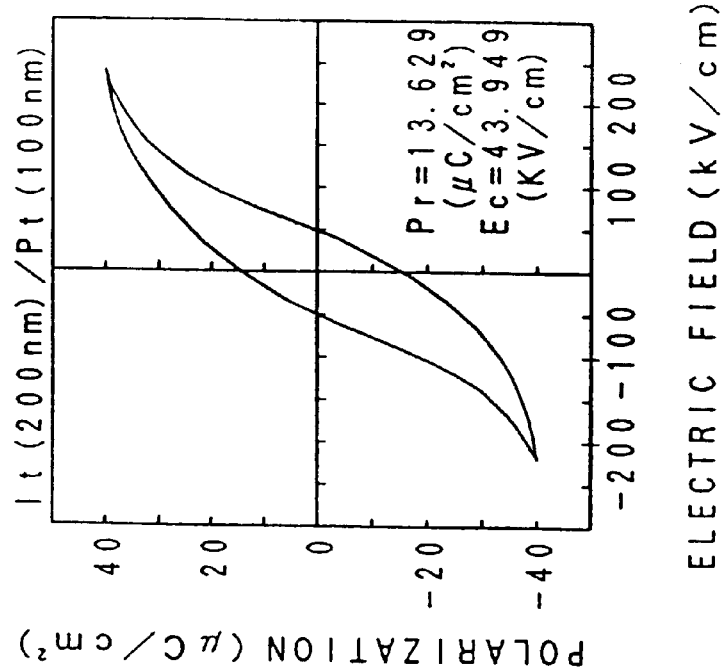

FIG. 15A shows a hysteresis characteristics when the titanium layer is formed as the buffer layer 30 under the lower electrode 12 made of iridium. Here, the silicon oxide layer is formed in thickness of 600 Å, thickness of the buffer layer is 5 nm, thickness of the lower electrode is 200 nm and thickness of PZT layer is 250 nm. As it is clear from the figure, characteristics of both remanent polarization Pr and coercive field Ec are improved in comparison with the characteristics shown in FIG. 13A.

Although, the titanium layer is used as the buffer layer 30 in above embodiment, it is possible to use other materials which improves adsorption for instance a platinum layer. Also, FIG. 15B shows a hysteresis characteristics when the platinum layer formed in thickness of 100 nm is used as the buffer layer. As it is clear to compare with FIG. 13A, characteristics of remanent polarization Pr, coercive field Ec are also improved in this embodiment.

The ferroelectric capacitor in the present invention is characterized to use lower electrode having an alloy layer comprises platinum and iridium. So that, it is possible to match lattice constant by varying composition ratio in correspond with kind or composition of the ferroelectric material. Also, it is possible to prevent vacancy of oxygen in the ferroelectric material by oxidized iridium.

The ferroelectric capacitor in this embodiment is also characterized to have the buffer layer contact with the silicon oxide layer, formed under the lower electrode. So that, adsorption of the ferroelectric layer can be improved.

Further, a method for manufacturing a ferroelectric capacitor in the present invention is characterized to comprise a step for forming the lower electrode made of an alloy layer for platinum and iridium or an iridium layer by carrying out thermal treatment to the lower electrode at above 700° C. So that, it is possible to prevent vacancy of oxygen in the ferroelectric material due to either of the iridium layer or iridium contained in the alloy layer is oxidized.

Also, a method for manufacturing a ferroelectric capacitor in the present invention comprises a step for forming the buffer layer attached with the silicon oxide layer, under the lower electrode. So that, adsorption of the ferroelectric layer can be improved.

Moreover, a method for manufacturing a ferroelectric capacitor in the present invention is characterized to carry out thermal treatment to form a ferroelectric layer which also conducts thermal treatment to the lower electrode. Therefore, it is possible to improve efficiency of production by simplify the processes. That is, in accordance with the present invention, a ferrolectric capacitor having high ferroelectricity can be provided.

Figure 16:
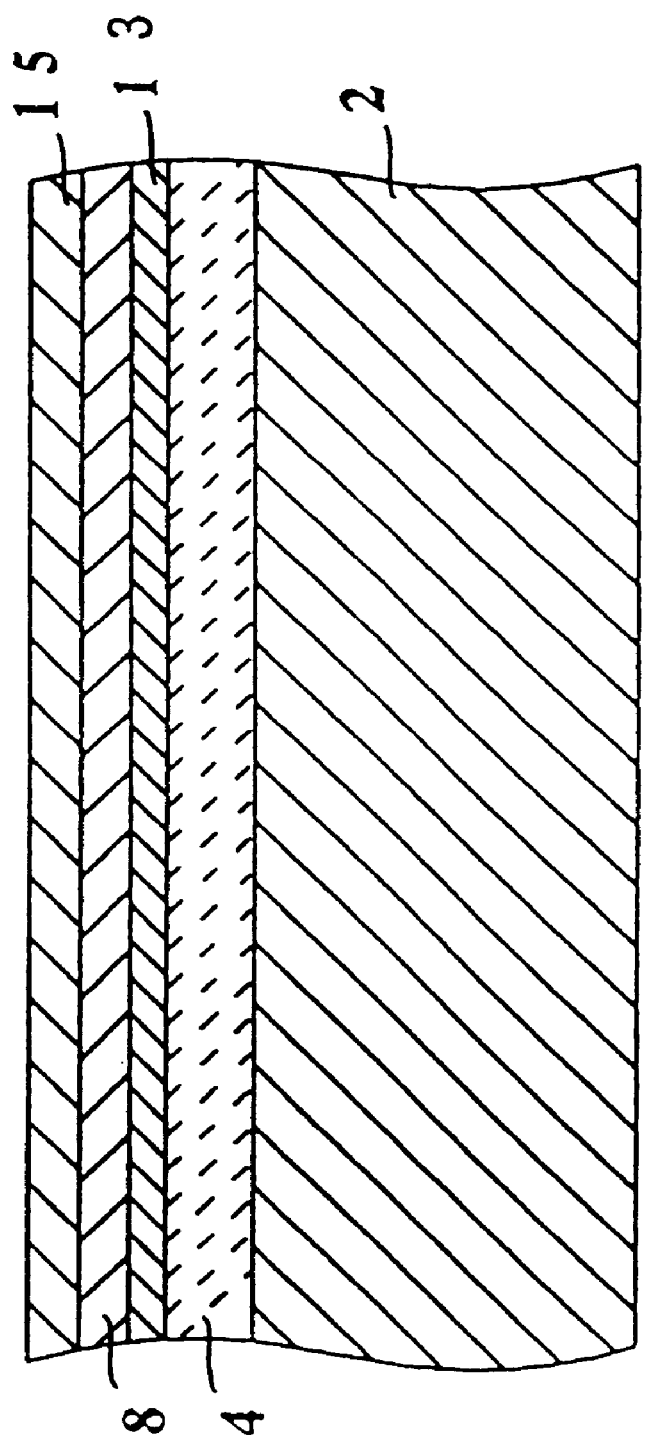
FIG. 16 is a view illustrating a structure of ferroelectric capacitor for an embodiment in the present invention.

FIG. 16 shows a structure of ferroelectric capacitor for another embodiment in the present invention. In this embodiment, a silicon oxide layer 4, a lower electrode 13, a ferroelectric layer 8 and an upper electrode 15 are formed on a silicon substrate 2. The lower electrode and the upper electrode are made of iridium oxide.

Characteristics of platinum and iridium are shown in FIG. 6 for comparison. As it is clear from the figure, resistivity of iridium oxide is $49 \times 10^{-6}$ Ωcm which is suitable material for electrodes.

Figure 1:
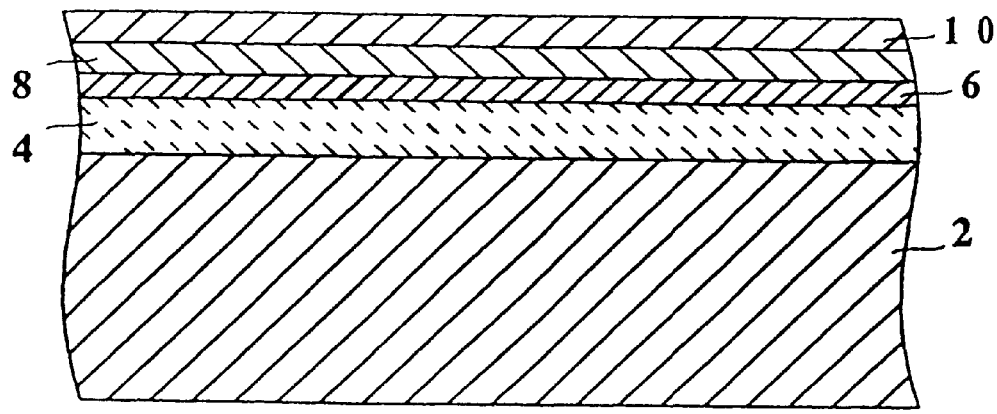
FIG. 1 is a view illustrating a structure of conventional ferroelectric capacitor.
Figure 2:
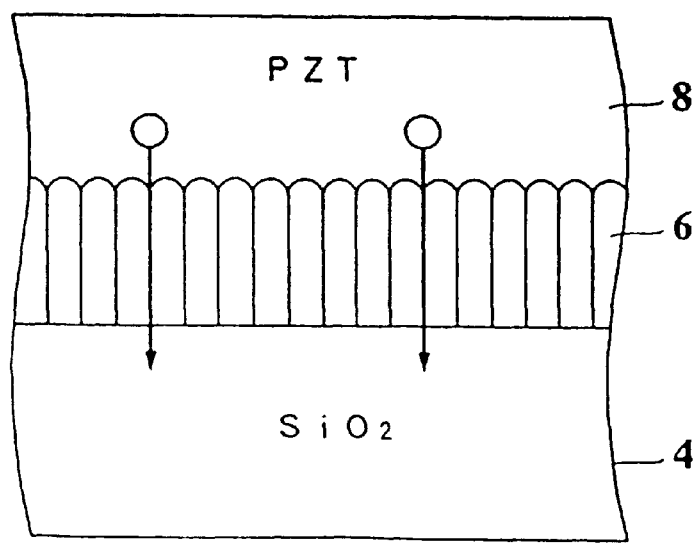
FIG. 2 is a view illustrating concept for oxygen goes through from the lower electrode 6 made of platinum layer.

Since platinum has columnar crystal structure as shown in FIG. 2 of the conventional embodiment, oxygen contained in the ferroelectric layer 8 can go through the platinum. Therefore, in this embodiment, the lower electrode 13 is formed by iridium oxide. Since the iridium layer does not have columnar crystal structure, it is hard for oxygen to go through the iridium layer. So that, it is possible to prevent vacancy of oxygen in the ferroelectric layer 8. This fact can be applied to the upper electrode 15.

The iridium oxide layer does not have axis orientation despite of a layer formed underneath (hereinafter referred as the under layer) is oriented axially or not oriented. So that, the ferroelectric layer 8 formed on the iridium oxide layer 8 is not oriented axially.

Figure 17A:
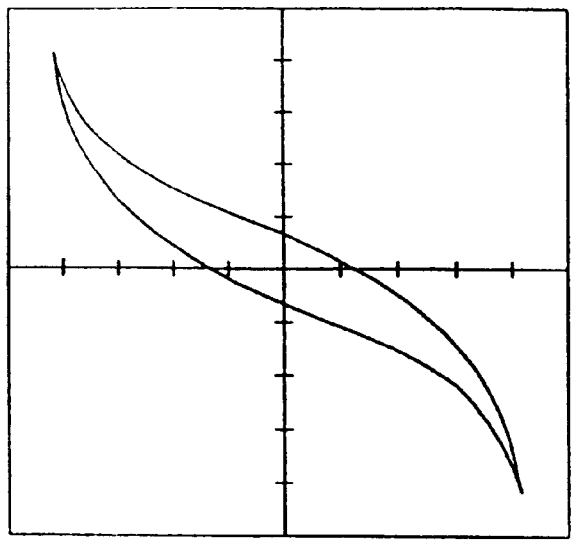
FIG. 17 is a view illustrating a graph shows a result that proving iridium oxide is not influenced by orientation of a under layer.
Figure 17B:
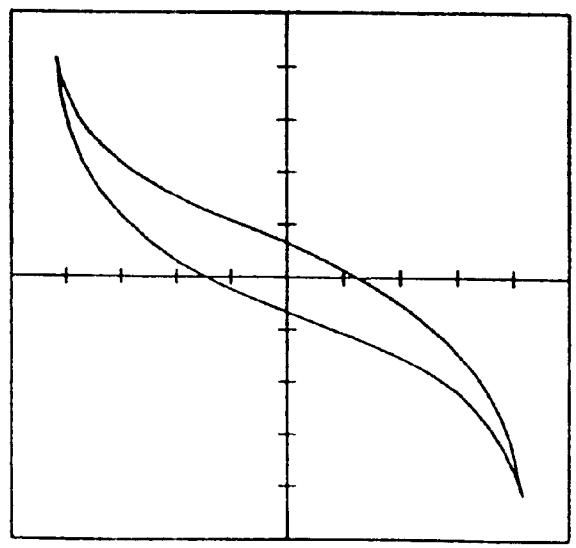

Following experiment is carried out to prove the iridium layer does not have axis orientation despite of the under layer is oriented axially or not. Comparison of hysteresis characteristics is conducted between a ferroelectric capacitor which comprises the lower electrode 13 made of iridium oxide formed directly on the silicon substrate 2 and a ferroelectric capacitor which comprises the lower electrode 13 made of iridium oxide formed on the silicon oxide layer 4. Hysteresis characteristics of above ferroelectric capacitors are shown in FIG. 17A and FIG. 17B. FIG. 17A shows the ferroelectric capacitor comprises the lower electrode 13 formed on the silicon oxide layer 4. FIG. 17B shows the ferrolectric capacitor comprises the lower electrode 13 made of iridium oxide formed directly on the silicon substrate 2. As it is clear from the figures, characteristics of the ferroelectric layer 8 is identical despite of the under layer is oriented axially or not oriented. In above experiment, both of the lower electrode 13 and the upper electrode 15 are formed by iridium oxide layer, either one of the electrodes can be formed in other material.

The ferroelectric capacitor thus formed as disclosed above can be applied to an nonvolatile memory device with combination of a transistor 24 as shown in FIG. 9.

Figure 18A:
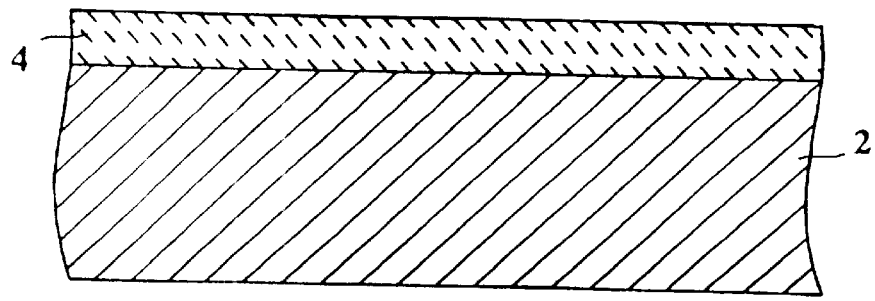
FIG. 18A to FIG. 18D are the view illustrating manufacturing process of ferroelectric capacitor.
Figure 18B:
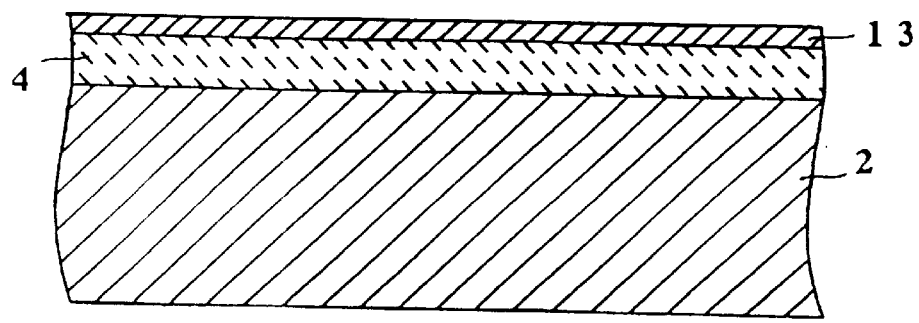

Manufacturing process of the ferroelectric capacitor for an embodiment in the present invention is shown in FIG. 18A to FIG. 18D. Initially, a silicon oxide layer 4 is formed by carrying out thermal oxidation to surface of a silicon substrate 2 (FIG. 18A). The silicon oxide layer is formed in thickness of 600 nm. A lower electrode 13 is formed by locating an iridium oxide layer on the silicon oxide layer 4 in reactive sputtering method with utilizing the iridium layer as a target (FIG. 18B). Here, the lower electrode 13 is formed in thickness of 200 nm.

Figure 18C:
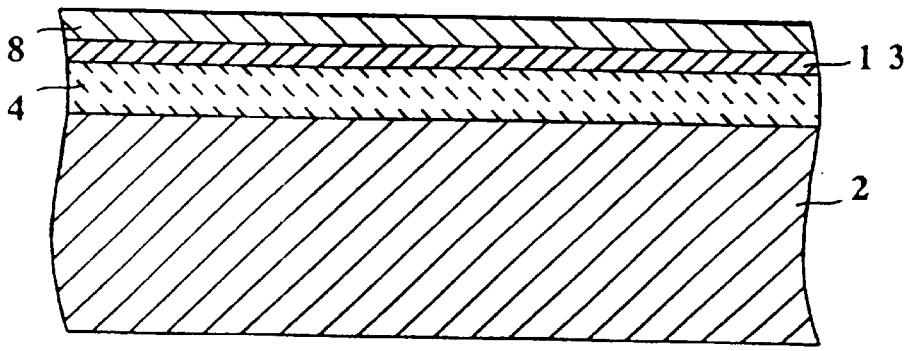

Subsequently, a PZT layer is formed as a ferroelectric layer 8 on the lower electrode 13 by sol-gel method as shown in FIG. 10C (FIG. 18C).

Figure 18D:
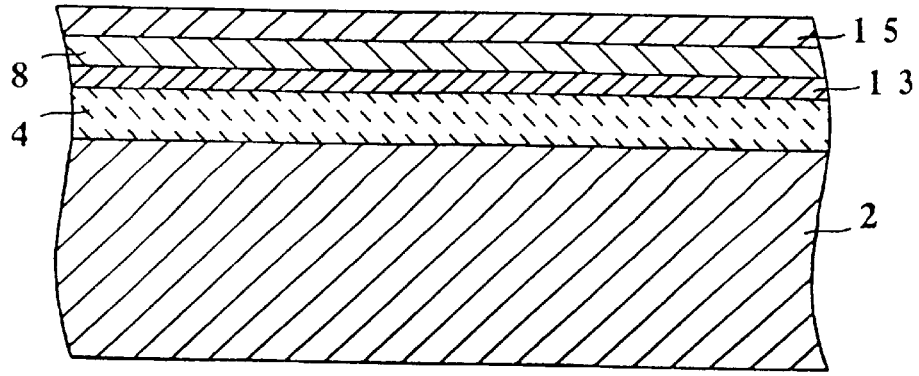

Further, an upper electrode 15 is formed by locating the iridium oxide layer on the ferroelectric layer 8 by reactive sputtering (FIG. 18D). Here, the upper electrode 15 is formed in thickness of 200 nm. Thus, the ferroelectric capacitor is obtained.

Figure 19:
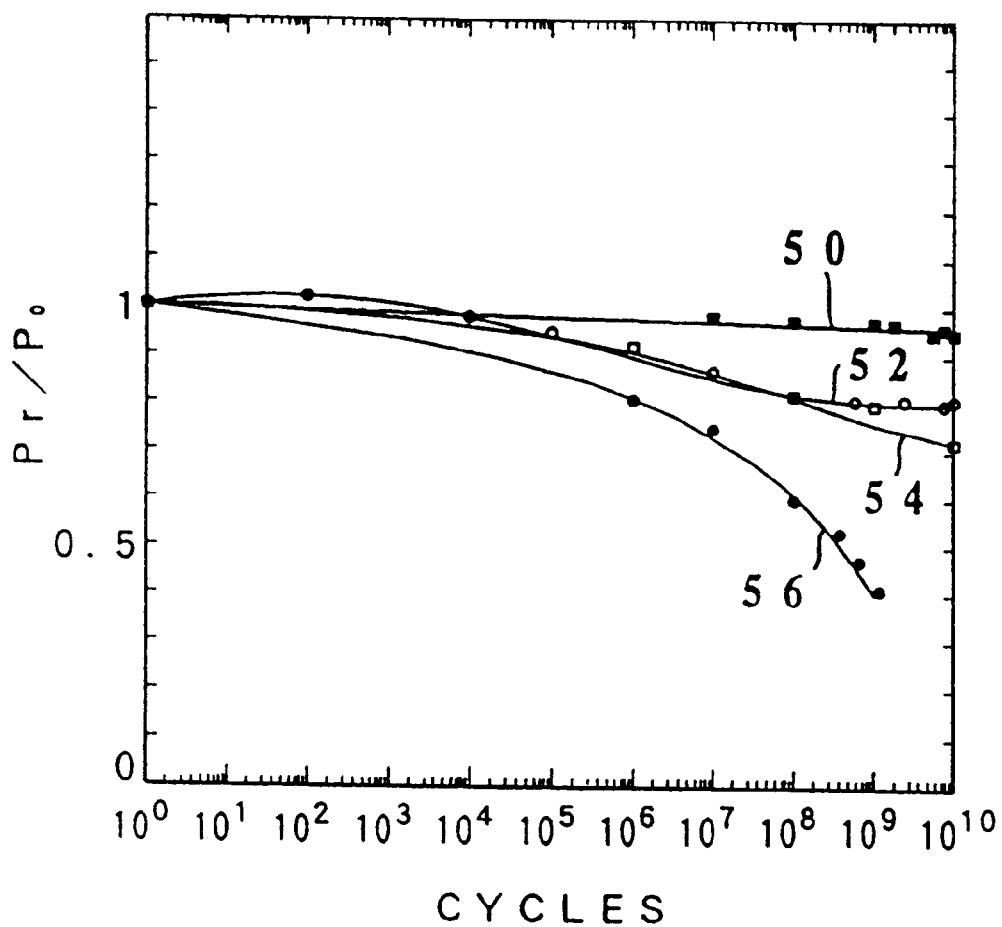
FIG. 19 is a view illustrating a graph shows variation of remanent polarization Pr.
Figure 20:
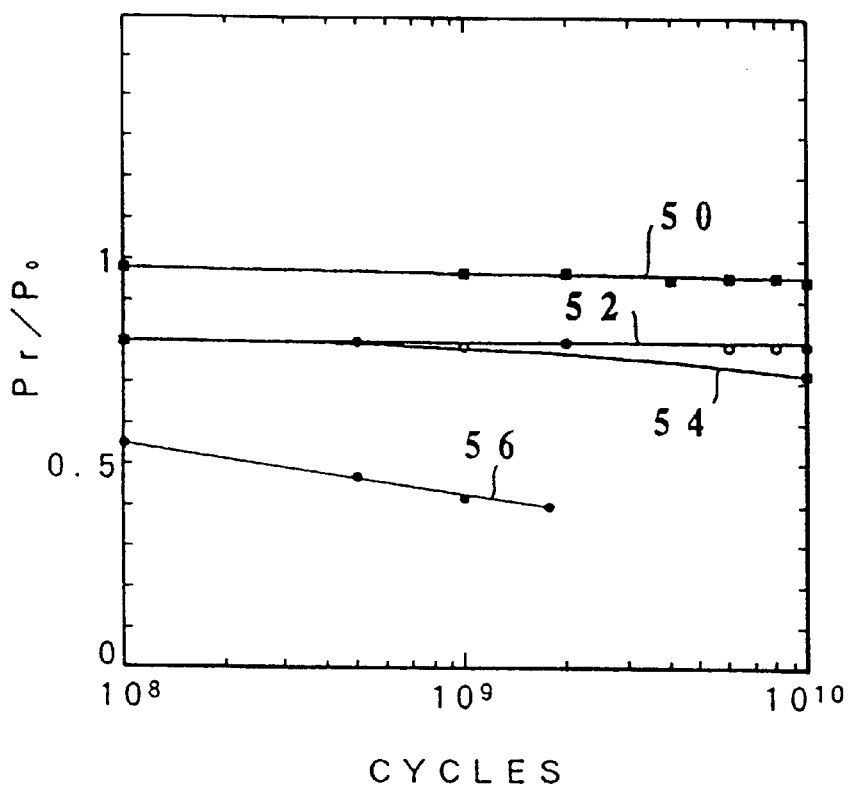
FIG. 20 is a view illustrating a graph shows variation of remanent polarization Pr.
Figure 22:
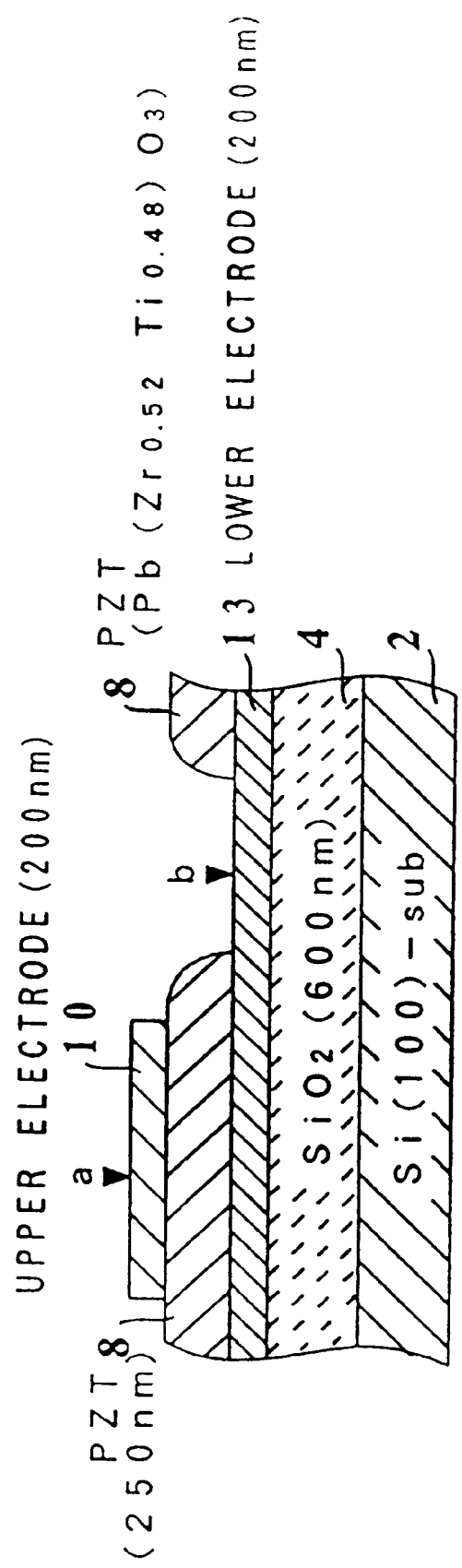
FIG. 22 is a view illustrating a structure for carrying out fatigue test.

A fatigue characteristics of remanent polarization Pr for a ferroelectric capacitor when the ferroelectric layer 8 is made of PZT (52/48) is shown in FIG. 19, and FIG. 20. An experiment is carried out with a ferrolectric capacitor under the structure shown in FIG. 22, by applying a voltage between point a and point b. Degradation of remanent polarization Pr is measured by applying a voltage of 5 V to −5 V between the upper electrode 15 and the lower electrode 13. The voltage of 5 V to −5V is defined as one (1) cycle (frequency of the voltage is set at 500 kHz).

The axis of ordinates of FIG. 19 and FIG. 20 shows value of Pr/Po, when initial remanent polarization is defined as Po and remanent polarization after the fatigue experiment is defined as Pr. The axis of abscissa shows number of cycles for the voltage shown in FIG. 21. In the figures, a curve 50 shows a variety of characteristics when the upper electrode 15 and the lower electrode 13 are both formed by iridium oxide layer. Also a curve 52 shows a variety of characteristics when the upper electrode 15 is made of platinum and the lower electrode 13 is made of iridium oxide layer. Further, a curve 54 shows a variety of characteristics when the upper electrode 15 is made of iridium oxide layer and the lower electrode 13 is made of platinum. A curve 56 shows a variety of characteristics when the upper electrode 15 and the lower electrode 13 are both formed by platinum.

As it is clear from the figures, degradation of remanent polarization Pr can be improved remarkably when either the upper electrode 15 or the lower electrode 13 is formed by iridium oxide layer. Further, occurrence of degradation can be suppressed until applying the voltage to $10^{10}$ cycle, when both the upper electrode 15 and lower electrode 13 are made of iridium oxide.

Figure 23A:
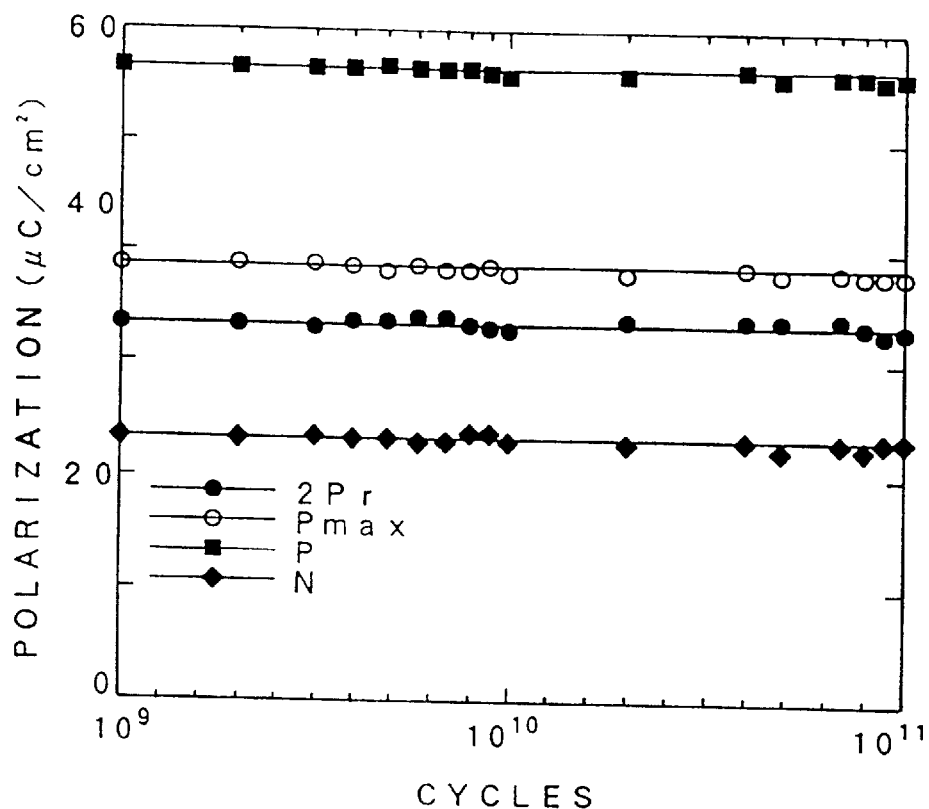
FIG. 23A is a view illustrating a graph shows variation of remanent polarization Pr when the platinum layer is formed on the iridium oxide layer.
Figure 23B:
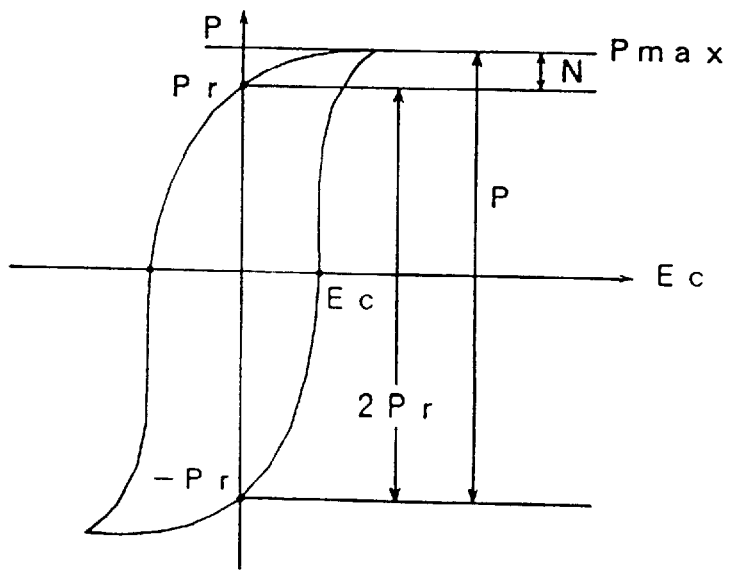
FIG. 23B is a view illustrating a graph shows variation of remanent polarization Pr when the platinum layer is formed on the iridium oxide layer.

Also, variety of characteristics is shown in FIG. 23A, when the lower electrode 13 made of the iridium oxide layer and the platinum layer formed thereon. Referring to FIG. 23A, Pr, Pmax, P, and N means the characteristics shown in FIG. 23B. As it is clear from the graph, further improvement is accomplished by forming the platinum layer on the iridium oxide layer. That is, only a slight degradation is observed until the voltage cycle reaches to $10^{11}$ cycles.

It seems that this is due to improvement of ferroelectricity as a result of orientation for the ferroelectric layer 8 by forming the platinum layer thereunder. So that, an iridium layer or an alloy layer of platinum and iridium can be a substitution of the platinum layer.

Figure 24:
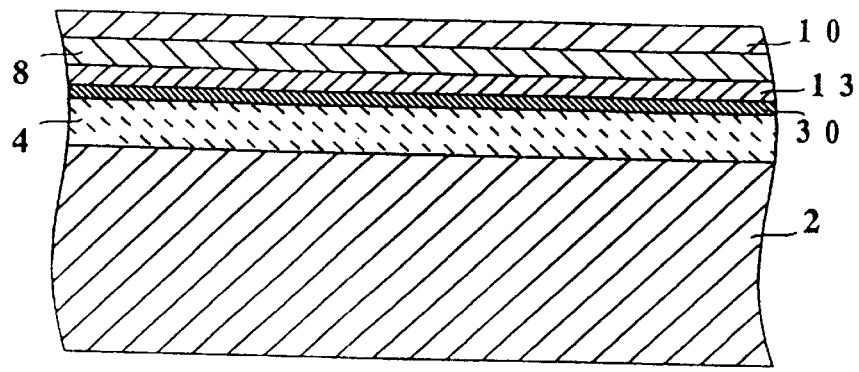
FIG. 24 is a view illustrating a structure of forming a buffer layer 30 between the lower electrode 13 and silicon oxide layer 4 for an embodiment in the present invention.

A structure of another embodiment for ferroelectric capacitor in the present invention is shown in FIG. 24. In this embodiment, titanium layer (thickness of 5 nm) is formed between the lower electrode 13 and silicon oxide layer 4 as a buffer layer. Since adsorption between the iridium oxide layer and the silicon oxide layer 4 is not enough to adhere both of them. So that, there is a possibility to degrade the ferroelectricity because of partial delamination of the layers. To resolve the issue, in this embodiment, the titanium layer which has better adsorption with the silicon oxide layer 4 is formed as the buffer layer 30. As a result, ferroelectricity of the capacitor is improved. Also, the titanium layer is formed by sputtering method.

In above disclosed embodiment, although the titanium layer is formed as the buffer layer 30, other material(s) can be a substitution of the titanium layer as long as the material(s) improves adsorption. For instance, a platinum layer can be applicable for the material.

In above disclosed embodiments, PZT is utilized as the ferroelectric layer 8, any ferroelectric oxide property can be applied to the ferroelectric layer. For instance $Bi_4Ti_3O_{12}$ can be utilized for the ferroelectric layer 8.

Also, the iridium oxide layer is formed by sputtering method in above disclosed embodiments, the iridium oxide layer can be formed by carrying out thermal treatment to iridium.

The ferroelectric capacitor in the present invention comprises a lower electrode or an upper electrode at least either one of them has an iridium oxide layer. So that, it is possible to prevent vacancy of oxygen in the ferroelectric layer by forming the iridium oxide layer.

Further, the ferroelectric capacitor in the present invention comprises a lower electrode made of a iridium oxide layer and a platinum layer formed thereon or the platinum layer. So that, ferroelectricity is improved, because of the ferroelectric layer is formed under axis oriented structure.

Still further, in a method for manufacturing a ferroelectric capacitor in the present invention, a step for forming an iridium oxide layer is included into at least either one of the step for forming a lower electrode or the step for forming an upper electrode. So that, it is possible to prevent vacancy of oxygen in the ferroelectric layer.

That is, a ferroelectric capacitor having characteristics of less degradation for retention property and fatigue property beside repeated polarization reverse can be obtained.

Figure 25:
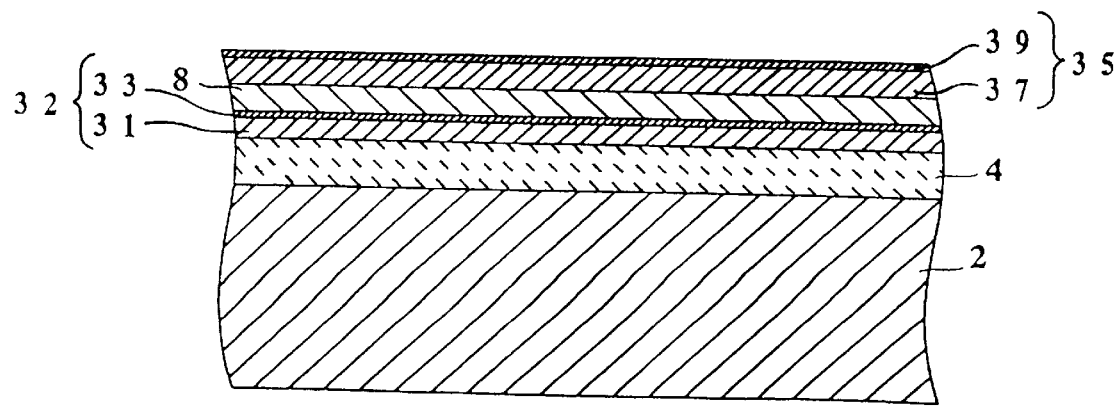
FIG. 25 is a view illustrating a structure of ferroelectric capacitor for an embodiment in the present invention.

A structure of another embodiment for ferroelectric capacitor in the present invention is shown in FIG. 25. In this embodiment, a silicon oxide layer 4, a lower electrode 32, a ferroelectric layer 8 and an upper electrode 35 are formed on a silicon substrate 2. The lower electrode 32 is formed by an iridium layer 31 and an iridium oxide layer 33 formed thereon. Also, the upper electrode 35 is formed by an iridium layer 37 and an iridium oxide layer 33 formed thereon.

Figure 26:
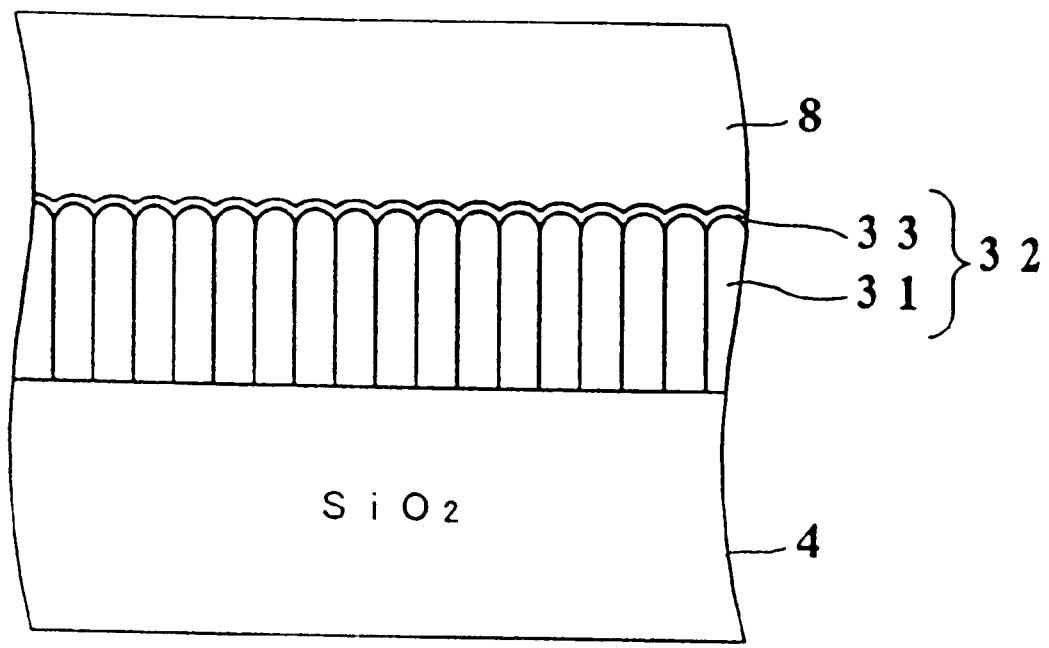
FIG. 26 is a view illustrating a structure for preventing leakage of oxygen by an iridium oxide layer 33.

FIG. 26 shows enlarged view adjacent to the lower electrode 32. Since the iridium layer 31 has columnar crystal structure, oxygen contained in the ferroelectric layer 8 can go through the iridium layer 31. In this embodiment, the iridium oxide layer 33 is formed on the upper surface of iridium layer 31. Since the iridium oxide layer 33 does not have columnar crystal structure, oxygen can not go through the iridium oxide layer 33 easily. So that, it is possible to prevent vacancy of oxygen. Further, the upper electrode 35 is formed under the same structure as the lower electrode 32, it is also possible to prevent vacancy of oxygen.

In above embodiment, the iridium oxide layer is formed on both the lower electrode and the upper electrode, the iridium oxide layer can be formed on either one of the electrodes.

The ferroelectric capacitor thus formed as disclosed above can be applied to an nonvolatile memory device with combination of a transistor 24 as shown in FIG. 9.

Figure 27A:
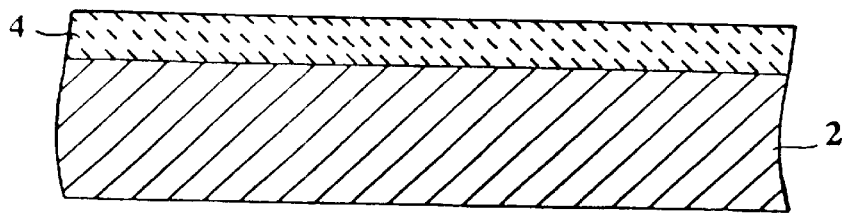
FIG. 27A to FIG. 27D are the view illustrating manufacturing process of ferroelectric capacitor.
Figure 27B:
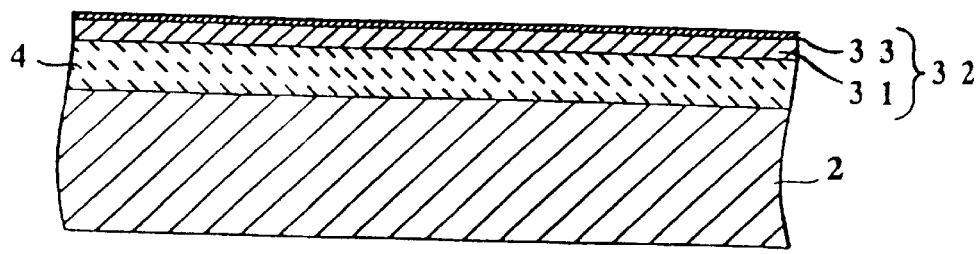

Manufacturing process of the ferroelectric capacitor for an embodiment in the present invention is shown in FIG. 27A to FIG. 27D. Initially, a silicon oxide layer 4 is formed by oxidizing surface of a silicon substrate 2 (FIG. 27A). Here, the silicon oxide layer 4 is formed in thickness of 600 nm. Then, an iridium layer 31 is formed on the silicon oxide layer 4 by utilizing iridium as a target by sputtering. Then, an iridium oxide layer 33 is formed on surface of the iridium layer 31 by carrying out thermal treatment under oxygen atmosphere at 800° C. for one (1) minute. The iridium layer 31 and the iridium oxide layer 33 are used as a lower electrode 32. Here, the lower electrode 32 is formed in thickness of 200 nm.

Figure 27C:
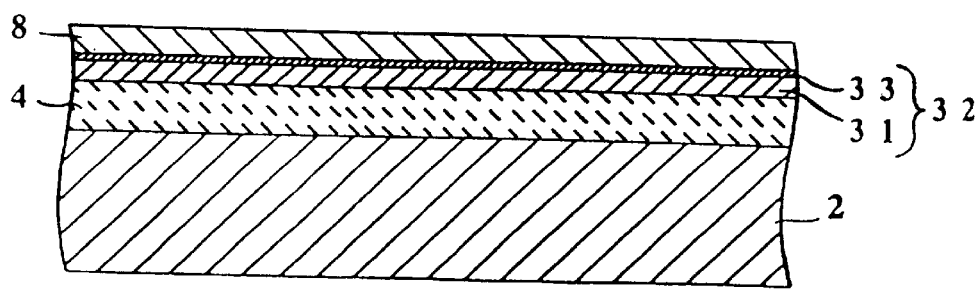

Subsequently, a PZT layer is formed as a ferroelectric layer 8 by sol-gel method as shown in FIG. 10C (FIG. 27C).

Figure 27D:
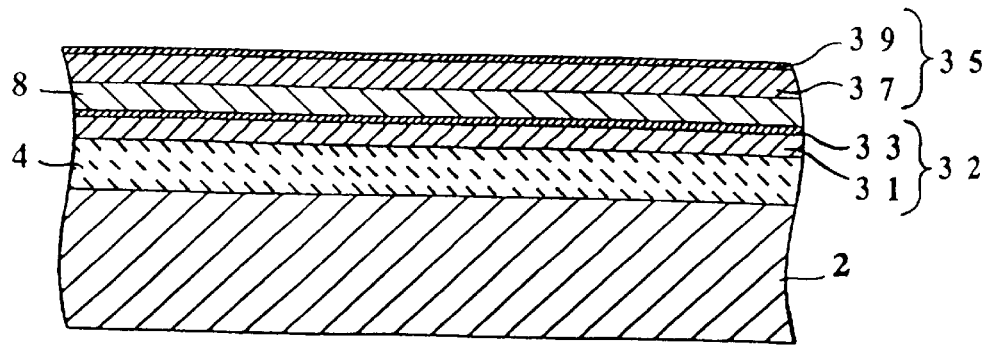

Further, an iridium layer 37 is formed on the ferroelectric layer 8 by sputtering. then, an iridium oxide layer 39 is formed on surface of the iridium layer 37 by carrying out thermal treatment under oxygen atmosphere at 800° C. for one (1) minute (FIG. 27D). Both the iridium layer 37 and the iridium oxide layer 39 are used as an upper electrode 35. Here, the upper electrode 35 is formed in thickness of 200 nm. Thus, a ferroelectric capacitor is obtained.

Figure 21:
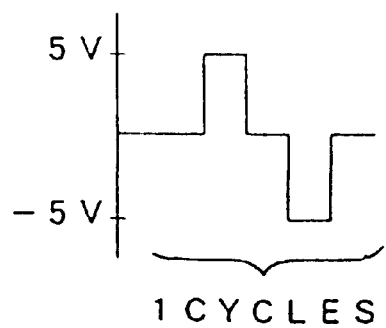
FIG. 21 is a view illustrating a graph shows a voltage applied to carry out fatigue test.
Figure 28:
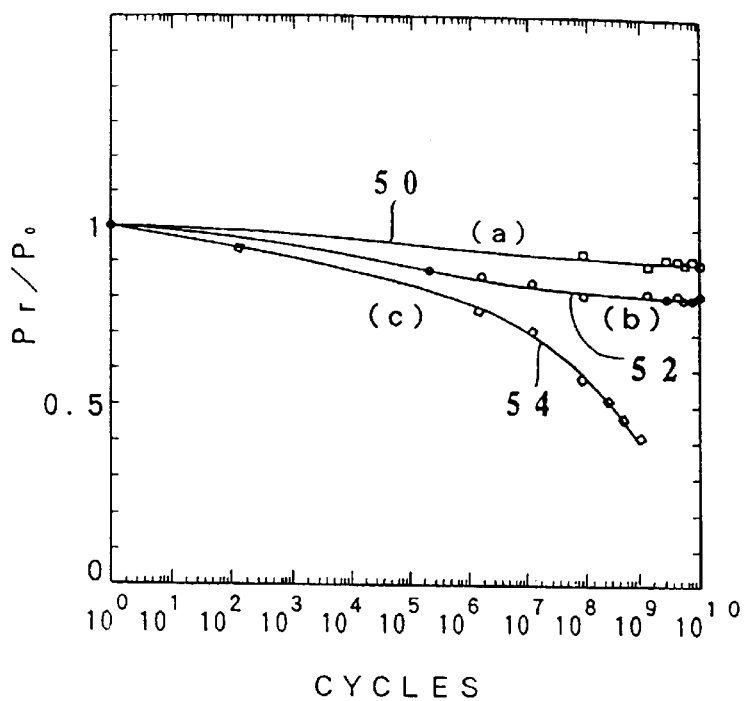
FIG. 28 is a view illustrating a graph shows variation of remanent polarization Pr.
Figure 29:
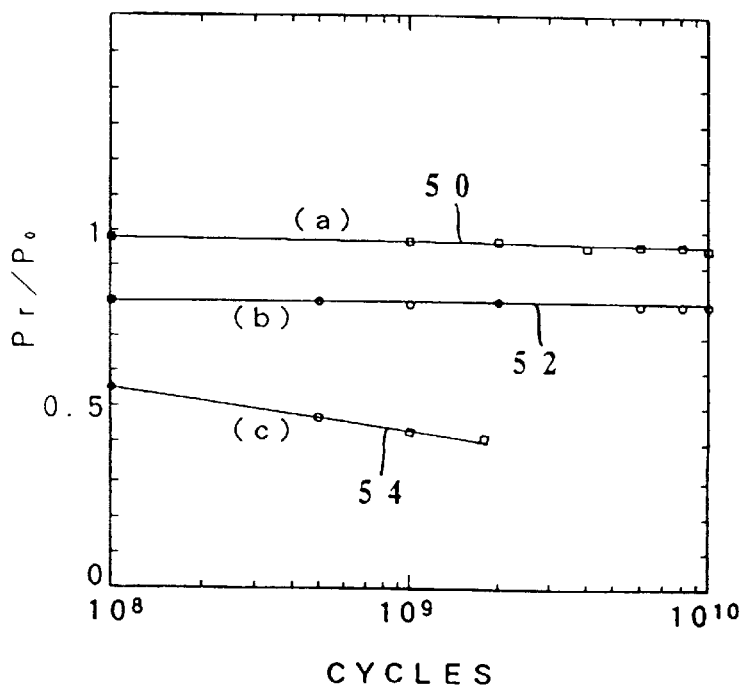
FIG. 29 is a view illustrating a graph shows variation of remanent polarization Pr.
Figure 30:
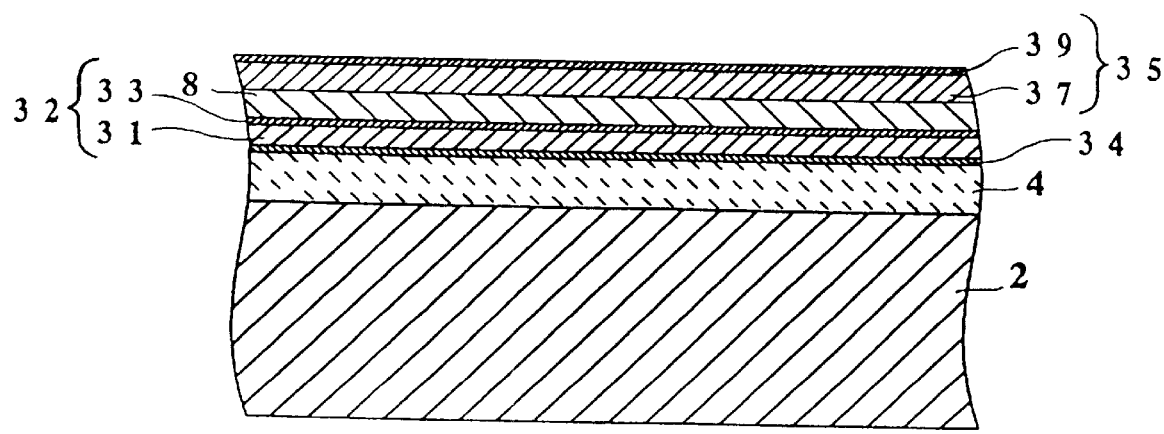
FIG. 30 is a view illustrating a structure of forming a buffer layer 34 between the lower electrode 32 and silicon oxide layer 4 for an embodiment in the present invention.

FIG. 28, and FIG. 29 show a fatigue characteristics of remanent polarization Pr for the ferroelectric capacitor when the ferroelectric layer 8 is made of PZT (52/48). Degradation of remanent polarization Pr is measured by applying a voltage of 5 V to −5 V as shown in FIG. 21 between the upper electrode 35 and the lower electrode 32. The voltage of 5 V to −5V is defined as one (1) cycle (frequency of the voltage is set at 500 kHz).

The axis of ordinates in FIG. 28 and FIG. 29 show a value of Pr/Po when initial remanent polarization is defined as Po and remanent polarization after the fatigue experiment is defined as Pr. The axis of abscissa shows number for cycle of the voltage shown in FIG. 21. In the figures, a curve 50 shows a variety of characteristics for remanent polarization when the silicon oxide layer is formed in thickness of 600 nm, the lower electrode 32 is formed with both the iridium layer 31 and the iridium oxide layer 33 in thickness of 200 nm, the ferroelectric layer is formed by PZT in thickness of 250 nm and the upper electrode 35 is formed by platinum in thickness of 200 nm. In the meantime, a curve 52 shows a variety of characteristics for remanent polarization when the surface of iridium layer 31 of the lower electrode 32 is not oxidized. Referring to the conditions, other conditions such as kind of layers and thickness of the layers are identical with the condition in the curve 50. Further, a curve 54 shows a variety of characteristics for remanent polarization when the lower electrode 32 is formed by platinum. Also the conditions are identical with the condition in the curve 50.

As it is clear from the figures, degradation of remanent polarization Pr is improved remarkably when the iridium oxide layer 31 is formed by carrying out oxidation to the surface of iridium layer 31. In this embodiment, a titanium layer is formed in thickness of 5 nm between the lower electrode 32 and the silicon oxide layer 4 as a buffer layer 34. As a result, ferroelectricity of the ferroelectric capacitor can be improved. The titanium layer is formed by sputtering method.

Although, the titanium layer is used as the buffer layer 34 in above embodiment, it is possible to use other materials as long as the material(s) improves adsorption such as platinum layer.

In above disclosed embodiment, though PZT is utilized as the ferroelectric layer 8, any other ferroelectric oxide property can be utilized. Such as $Bi_4Ti_3O_{12}$ can be a substitution. Also, it is expected to accomplish the same advantages as described above by using ferroelectric properties of fluoride, chloride, bromide as the ferroelectric layer 8.

A ferroelectric capacitor in the present invention comprises the lower electrode or the upper electrode, at least either one of them are formed by the iridium layer and the iridium oxide layer formed thereon by oxidized the surface of the iridium layer. Therefore, it is possible to prevent vacancy of oxygen.

In a method for manufacturing a ferroelectric capacitor in the present invention comprises a step for forming the iridium layer by sputtering, and a step for forming the iridium oxide layer thereon by oxidizing at least the surface of iridium layer are included into at least either one of a step for forming the lower electrode or a step for forming the upper electrode. So that, it is possible to prevent vacancy of oxygen in the ferroelectric layer.

Figure 31:
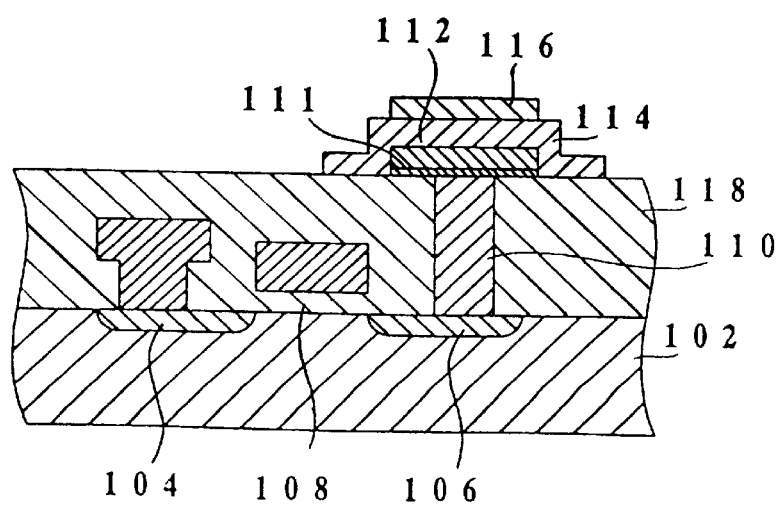
FIG. 31 is a view illustrating a structure of memory device utilizing a ferrolectric capacitor for an embodiment in the present invention.

FIG. 31 shows a structure of a memory device for an embodiment in the present invention utilizing a ferroelectric capacitor. A source region 104 and a drain region 106 are formed in a silicon substrate 102, a gate electrode 108 is formed on a channel region. A plug 110 made of poly silicon (or tungsten) is formed as an under layer on the drain region 106 of the device. In the FIG. 31, an insulating layer 118 is formed on the silicon substrate 102.

Figure 4A:
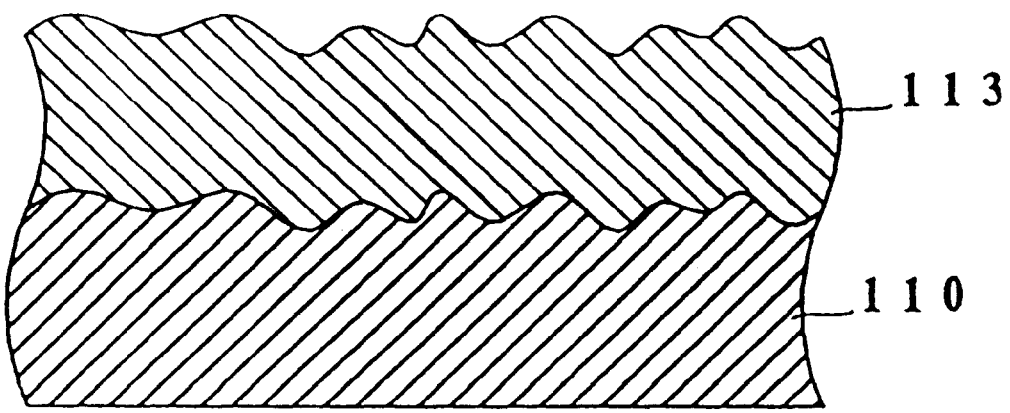
FIG. 4A is a view illustrating a concept for a tantalum layer formed on poly silicon.
Figure 4B:
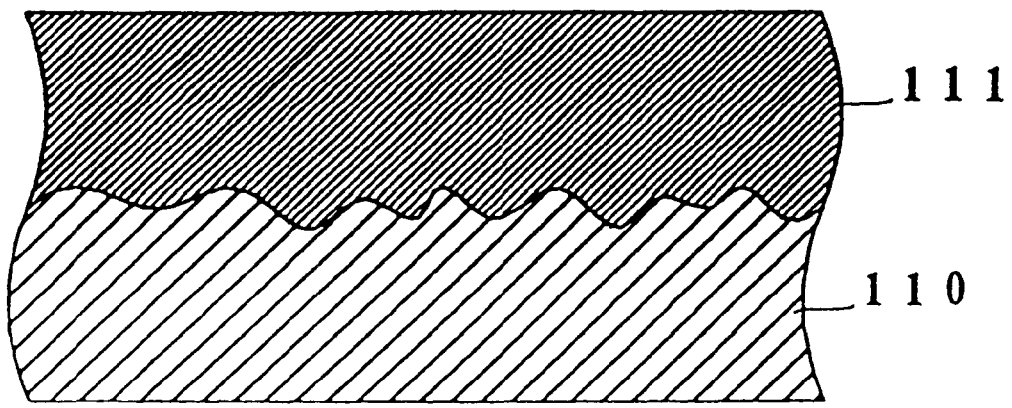
FIG. 4B is a view illustrating a concept for an iridium oxide layer formed on poly silicon.

An iridium oxide layer 111 is formed on the poly silicon plug 110. The iridium oxide layer 111 can be formed by utilizing iridium as a target by reactive sputtering. As shown in FIG. 4B, the iridium layer 111 has characteristics that the surface is flattened even though condition of the under layer is in rough. Also, resistivity of the iridium oxide layer is $49 \times 10^{-6}$ Ωcm, and the iridium oxide layer can be treated as a conductive property.

A platinum layer 112 is formed on the iridium oxide layer 111. So that, the platinum layer 112 is oriented axially. Then a PZT layer 114 is formed as a ferroelectric material, also a platinum layer 116 is formed thereon as an upper electrode. Thus, a memory device is formed. That is, in this embodiment, a middle layer is formed by the iridium oxide layer 111 and the platinum layer 112.

In according to this embodiment, the platinum layer 112 does not contact with the poly silicon plug 110 directly. Further, the platinum layer 112 is formed on the iridium oxide layer 111 which has characteristics that the upper surface is flattened even though condition of the under layer is in rough. Therefore, a PZT layer having excellent ferroelectric characteristics can be obtained because of the platinum layer 112 is oriented axially. Also, better characteristics is able to obtained, since a low dielectric oxide is not formed to a boundary between the iridium oxide layer 111 and the poly silicon plug 110.

An iridium layer or an alloy layer made of platinum and iridium can be a substitution of the platinum layer 112, 116.

Figure 32:
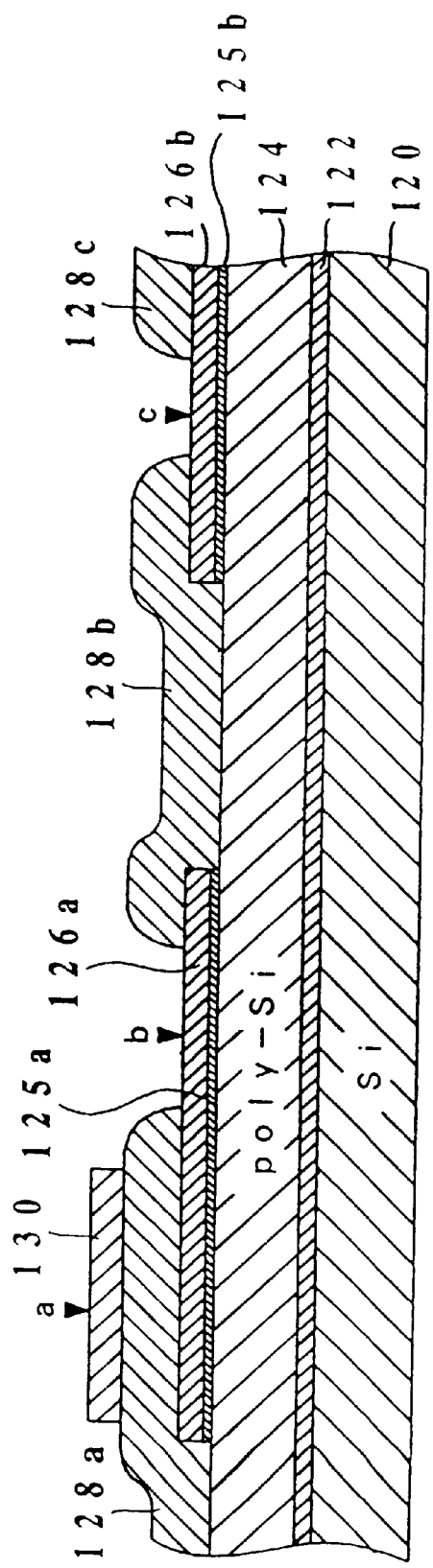
FIG. 32 is a view illustrating a structure for carrying out a characteristics of the ferroelectric capacitor.

In this embodiment, it is disclosed that when the under layer is made of poly silicon plug 110, exactly the same advantage can be expected when the plug is made of tungsten. Further, the plug can be made by polycide to obtain the advantages disclosed above. Here, polycide is a material which is formed by metal silicide (tungsten silicide, titanium silicide, molybdenum silicide, tantalum silicide or the like) in layer structure. To verify improvement of characteristics for the PZT layer when the platinum layer is formed on the iridium layer, an experiment is carried out under a structure shown in FIG. 32. In the figure, a poly silicon layer 124 is formed on a silicon oxide layer 122 and a silicon substrate 120. An iridium oxide layer 125a, a platinum layer 126a, an iridium oxide layer 125b and a platinum layer 126b are formed on the poly silicon layer 124, also a PZT layer 128a, PZT layer 128b and PZT layer 128c are formed on thereon. Further, a platinum layer 130 is formed on the PZT layer 128a as an upper electrode.

Figure 3A:
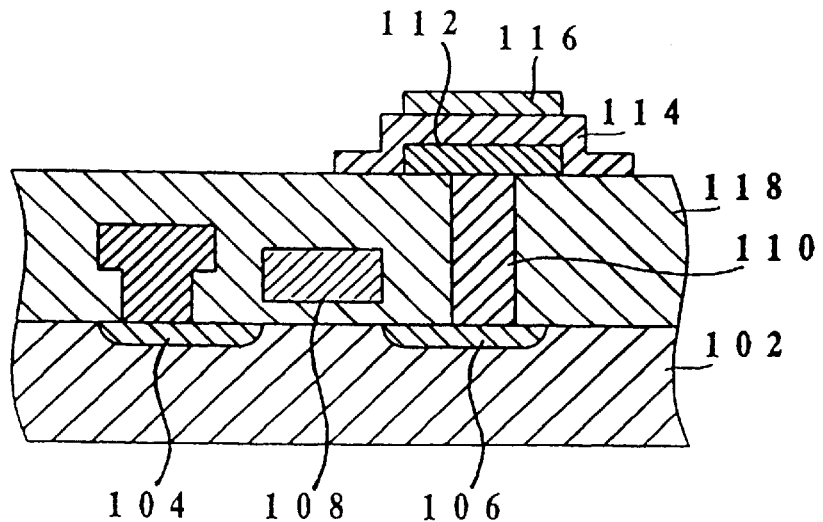
FIG. 3A is a view illustrating a structure of memory device utilizing a conventional ferroelectric capacitor.
Figure 3B:
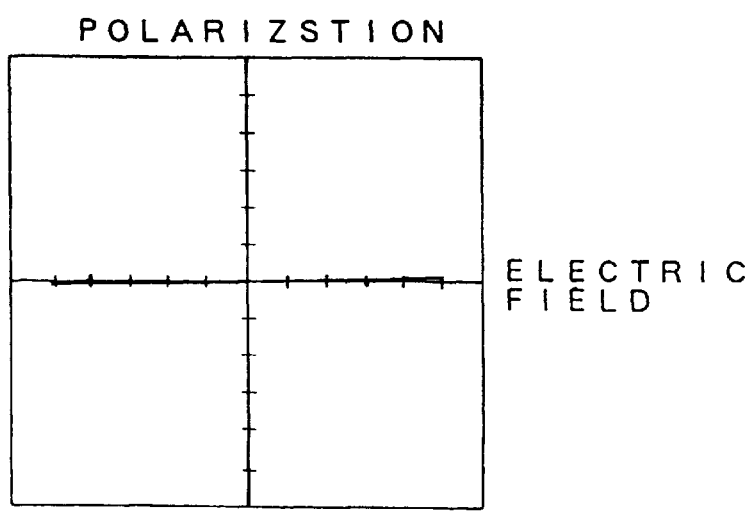
FIG. 3B is a view illustrating a characteristics of ferroelectric material when a platinum layer is formed on poly silicon.
Figure 33A:
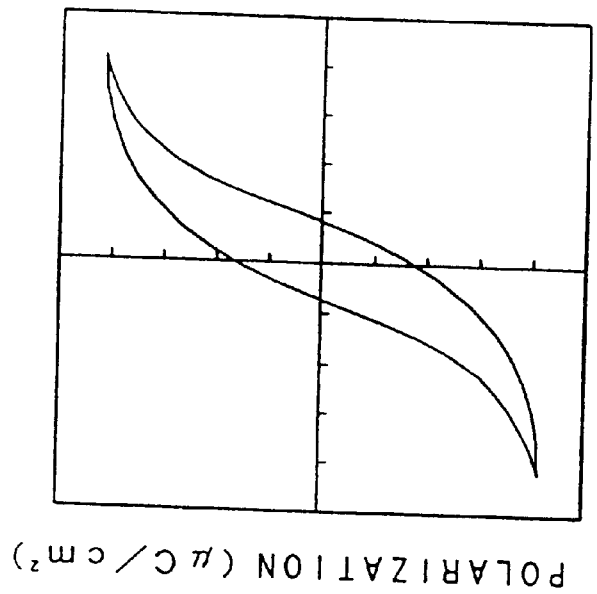
FIG. 33 is a view illustrating a graph shows a hysteresis characteristics of the ferroelectric capacitor.
Figure 33B:
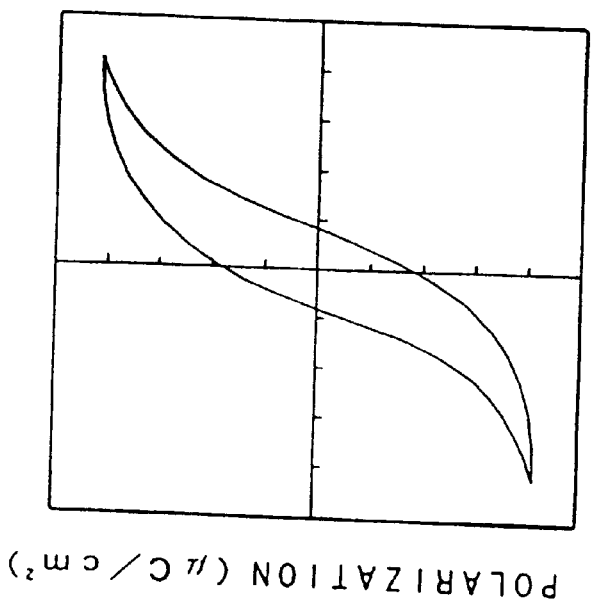

A hysteresis curve measured between point a and point b is shown in FIG. 33A. It is clearly understand that ferroelectricity of PZT layer 128a is improved tremendously in comparison with the hysteresis curve shown in FIG. 3B.

Figures 34A, 34B:
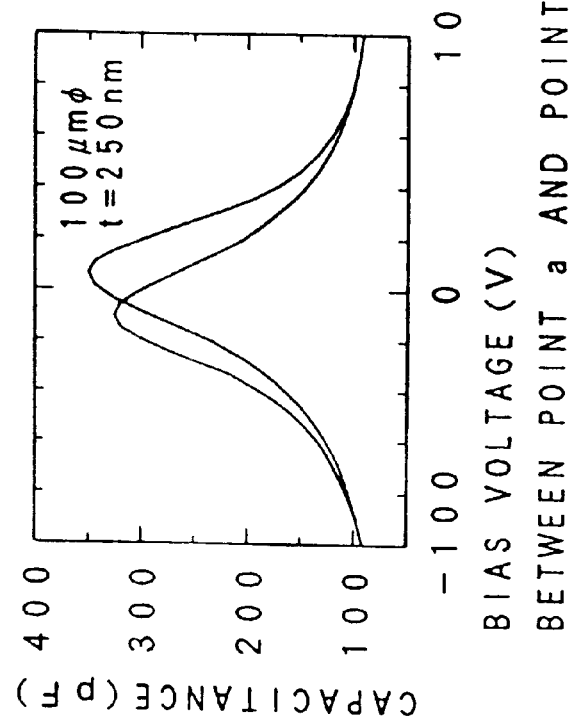
FIG. 34A and FIG. 34B are the view illustrating graphs showing capacitance measured between point a and point b in FIG. 33, and capacitance measured between point a and point c in FIG. 33.

Subsequently, FIG. 34A and FIG. 34B are a result of measurement of capacitance when varying an applied voltage between point a and point b, point a and point c. Capacitance between point a and point b is shown in FIG. 34A and capacitance between point a and point c is shown in FIG. 34B. In an assumption, once a low dielectric constant oxide is formed in a boundary between the poly silicon layer 124 and the iridium oxide layer 125a, 125b when the layers are formed, capacitance of these layers are supposed to different with each other. However, since capacitance of the layers are almost identical as shown in FIG. 34A and FIG. 34B. So that, it can be estimated that a low dielectric constant oxide is not formed in the boundary.

An iridium layer can be a substitution of the platinum layer 126a. FIG. 33A is a hysteresis curve measured between point a and point b when an iridium layer is used instead of the platinum layer 126a. In this case, an excellent ferroelectricity is indicated.

FIG. 35 shows a structure of nonvolatile memory device for an embodiment in the present invention. In this embodiment, a source region 160 and a drain region 162 are formed in a silicon substrate 140. A silicon oxide layer 142 is formed on a channel region 164 which is formed between the source region 160 and the drain region 162. A lower electrode 154 is formed on the silicon oxide layer 142, then a PZT layer 150 is formed thereon as a ferroelectric layer. The PZT layer 150 is formed by sol-gel method as disclosed in FIG. 10C. The PZT layer is formed in thickness of 250 nm, then a platinum layer 152 is formed thereon as an upper electrode.

The lower electrode 154 comprises a poly silicon layer 144, an iridium oxide layer 146 formed thereon and a platinum layer 148 (iridium layer can be a substitution) formed on the iridium oxide layer 146. The iridium oxide layer 146 can be formed by reactive sputtering.

An nonvolatile memory device which has excellent characteristics can be obtained, once the nonvolatile memory device is formed as disclosed above. Also, even though thermal treatment in high temperature is carried out to the source region 160 and the drain region 162 for self-alignment purposes, not much oxide is formed in a boundary formed between the poly silicon layer 144 and the iridium oxide layer 146, as far as maintaining above disclosed structure. Further, it is possible to utilize the conventional MOS processes to the processes until forming the silicon oxide layer 142 and poly silicon layer 144 in this embodiment.

Additionally, once an iridium layer is formed between the poly silicon layer 144 and the iridium oxide layer 146, it is further possible to prevent forming a low dielectric constant property at high temperature thermal treatment. This is due to the iridium layer formed in the boundary is turned out to an iridium oxide layer having conductiveness even if the iridium layer is oxidized.

Also, in above embodiments, PZT is utilized as a ferroelectric material, any ferroelectric material can be used. For instance, $Bi_4Ti_3O_{12}$ is usable. Moreover, a high dielectric constant thin film can be used for DRAM. Especially, a high dielectric constant property having $AbO_3$ structure (perovskite structure) such as $SrTiO_3$, $(Sr, Ba)TiO_3$ or the like is preferable.

Further, iridium oxide is not formed in columnar structure which is different from platinum, oxygen contained in the ferroelectric layer does not go through iridium oxide. So that, by utilizing iridium has an advantage of preventing degradation of the ferroelectric layer.

In above embodiments, the middle layers are formed in 2 layers, these layers can be formed in 3 layer structure or more. Once an iridium oxide layer is included in the middle layers when the middle layers are formed, it is possible for the iridium oxide layer to eliminate influences such as orientation or the like caused by a layer formed thereunder to a layer formed thereon. This is due to characteristics of the iridium oxide layer that not be influenced by orientation of the layer formed thereunder.

A ferroelectric capacitor and an nonvolatile memory device in the present invention comprises a structure of an iridium oxide layer is located on an under layer, then a platinum layer (or an iridium layer) is formed thereon, and a ferroelectric layer (or a high dielectric constant thin film) is formed thereon. Since the platinum layer (or an iridium layer) formed on the iridium oxide layer is oriented axially, so that, quality of the ferroelectric layer (or a high dielectric constant thin film) formed thereon is improved.

Also, the ferroelectric capacitor in the present invention comprises an iridium layer between the under layer and the iridium oxide layer. To form the iridium layer, a low dielectric property is not formed in a boundary between the iridium layer and the under layer, even though thermal treatment is carried out in high temperature.

Further, the ferroelectric capacitor in the present invention include an iridium oxide layer in the middle layer. So that, influence of a layer formed underneath the under layer and influence of the iridium oxide layer caused by roughness of grain for the layer are not given to a layer formed on the iridium oxide layer.

That is, an ferroelectric capacitor and an nonvolatile memory device having excellent characteristics is obtained in the present invention.

What is claimed is:

1. A ferroelectric capacitor comprising:

a semiconductor substrate;

an iridium layer formed on the semiconductor substrate and made of crystals between which iridium oxide layer is formed;

a platinum layer formed on the iridium layer;

a ferroelectric layer formed on the iridium layer; and an upper electrode formed on the ferroelectric layer.

2. A ferroelectric capacitor according to claim 1, further comprising a buffer layer interposed between the iridium layer and said semiconductor substrate.

3. A ferroelectric capacitor comprising:

a semiconductor substrate;

a lower electrode layer formed on the semiconductor substrate, made of an iridium-platinum alloy and containing iridium oxide therein;

a ferroelectric layer formed on the lower electrode; and an upper electrode formed on the ferroelectric layer.

4. A ferroelectric capacitor according to claim 3, wherein said iridium-platinum alloy comprises columnar crystals.

5. A ferroelectric capacitor according to to claim 3, wherein said semiconductor substrate comprises source/drain regions, and the lower electrode is formed on a plug formed on one of the source/drain regions.

6. A ferroelectric capacitor according to the claim 3, wherein said iridium-platinum alloy contains 25 weight % of iridium.

\* \* \* \* \*